(12) United States Patent
Chen et al.

(10) Patent No.: US 11,316,033 B2
(45) Date of Patent: Apr. 26, 2022

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Jin-Dah Chen, Hsinchu (TW); Stan Chen, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 77 days.

(21) Appl. No.: 16/900,748

(22) Filed: Jun. 12, 2020

(65) Prior Publication Data

US 2021/0391442 A1 Dec. 16, 2021

(51) Int. Cl.
*H01L 29/66* (2006.01)
*H01L 21/8234* (2006.01)
*H01L 29/78* (2006.01)

(52) U.S. Cl.
CPC .. *H01L 29/6681* (2013.01); *H01L 21/823431* (2013.01); *H01L 29/785* (2013.01)

(58) Field of Classification Search
CPC ............... H01L 29/6681; H01L 29/785; H01L 21/823431
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2021/0262090 A1* | 8/2021 | Cheng | C23C 16/403 |
| 2021/0398861 A1* | 12/2021 | Lee | H01L 21/823842 |
| 2022/0005952 A1* | 1/2022 | Singh | H01L 29/42376 |

* cited by examiner

*Primary Examiner* — Christine A Enad
(74) *Attorney, Agent, or Firm* — Maschoff Brennan

(57) ABSTRACT

A method includes forming a work function metal layer over first and second semiconductor fins extending upward from a substrate; forming a sacrificial layer straddling the first semiconductor fin but not overlapping the second semiconductor fin; patterning the first work function metal layer using the sacrificial layer, resulting in a patterned work function metal layer under the sacrificial layer, and a work function metal residue in the vicinity of the second semiconductor fin; selectively forming a protective layer on a side surface of the sacrificial layer and a side surface of the patterned first work function metal layer; removing the work function metal residue after selectively forming the protective layer; after removing the work function metal residue, removing the sacrificial layer and the protective layer; and forming a second work function metal layer over the first and second semiconductor fins.

20 Claims, 35 Drawing Sheets

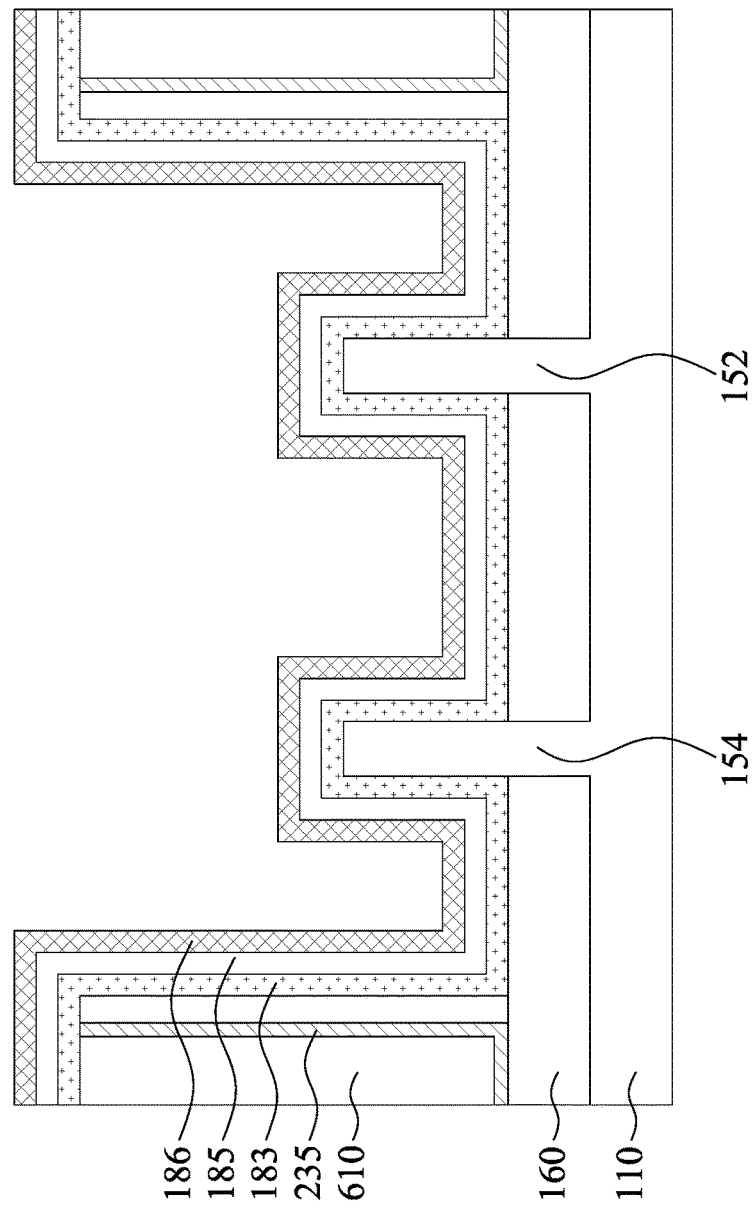

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17B is a cross sectional view along line B-B in FIG. 17A.

DETAILED DESCRIPTION

Figure 1A:
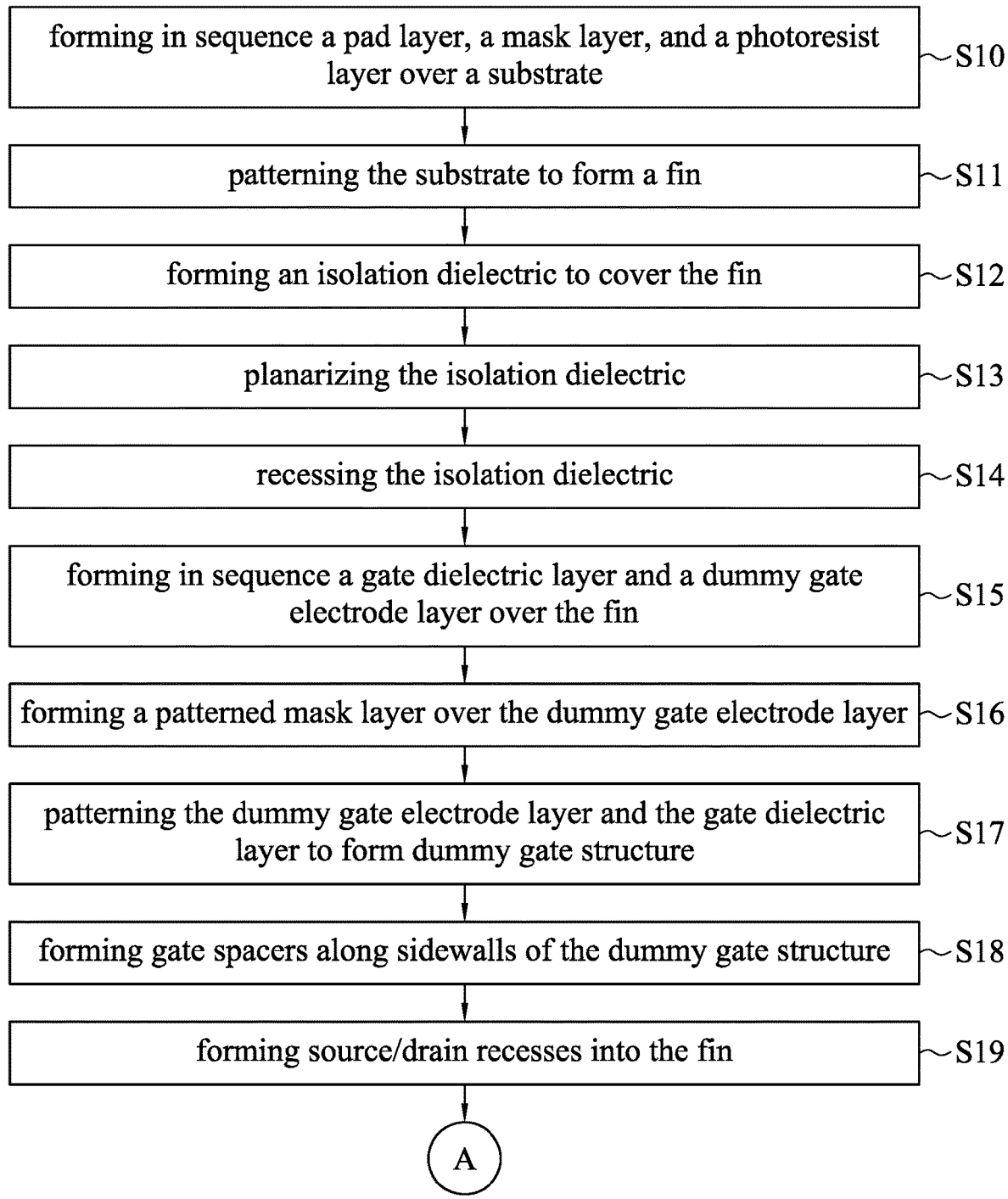
FIGS. 1A-1C illustrate a block diagram of a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. By way of example and not limitation, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to, but not otherwise limited to, a fin-like field-effect transistor (FinFET) device. The FinFET device, by way of example and not limitation, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. By way of example and not limitation, the fins may be patterned using one or more photolithography processes, including double-patterning or multi-patterning processes. The double-patterning or the multi-patterning processes combine photolithography and self-aligned processes, allowing patterns to be created that have, by way of example and not limitation, pitches smaller than what is otherwise obtainable using a single, direct photolithography process. By way of example and not limitation, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
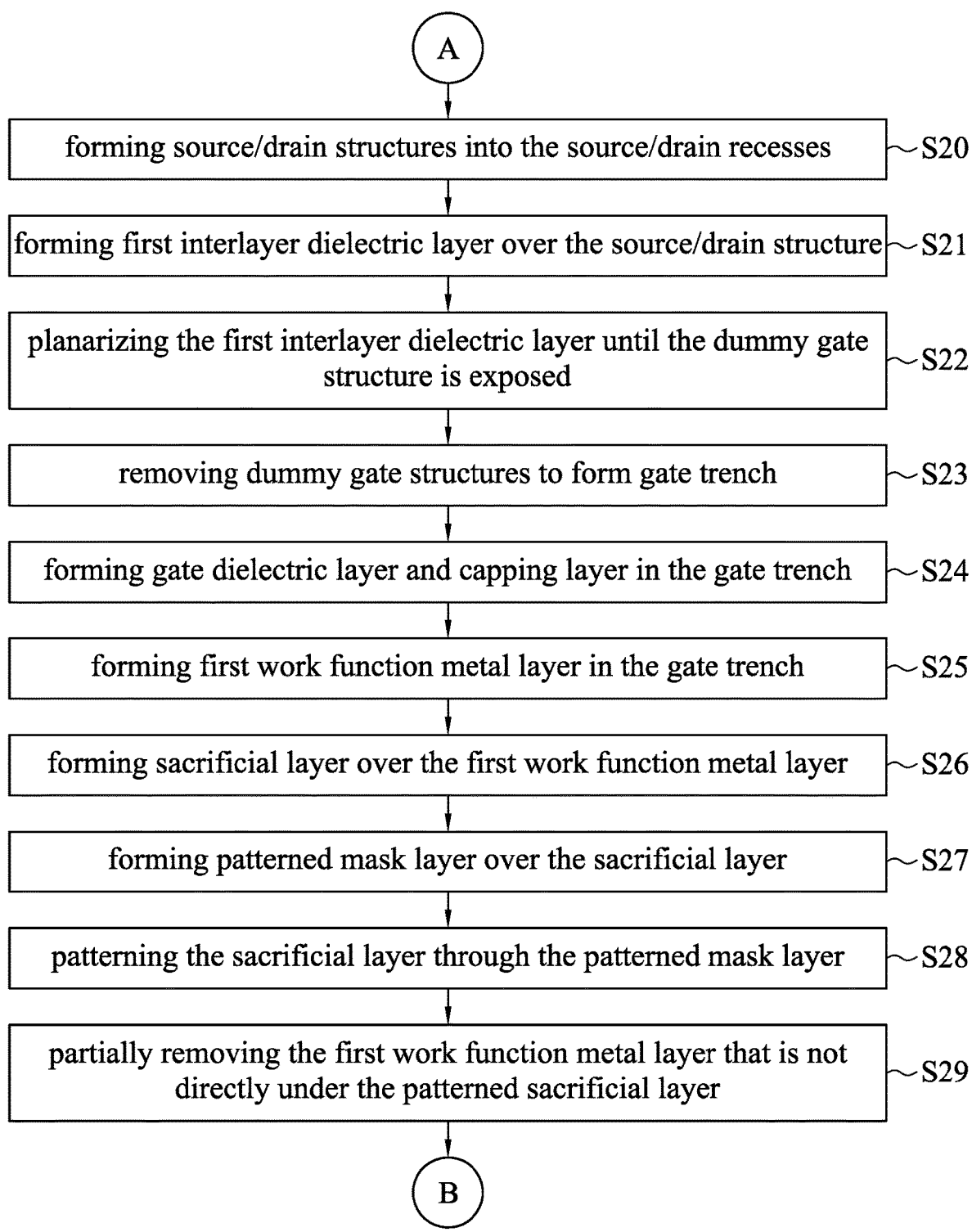
Figure 1C:
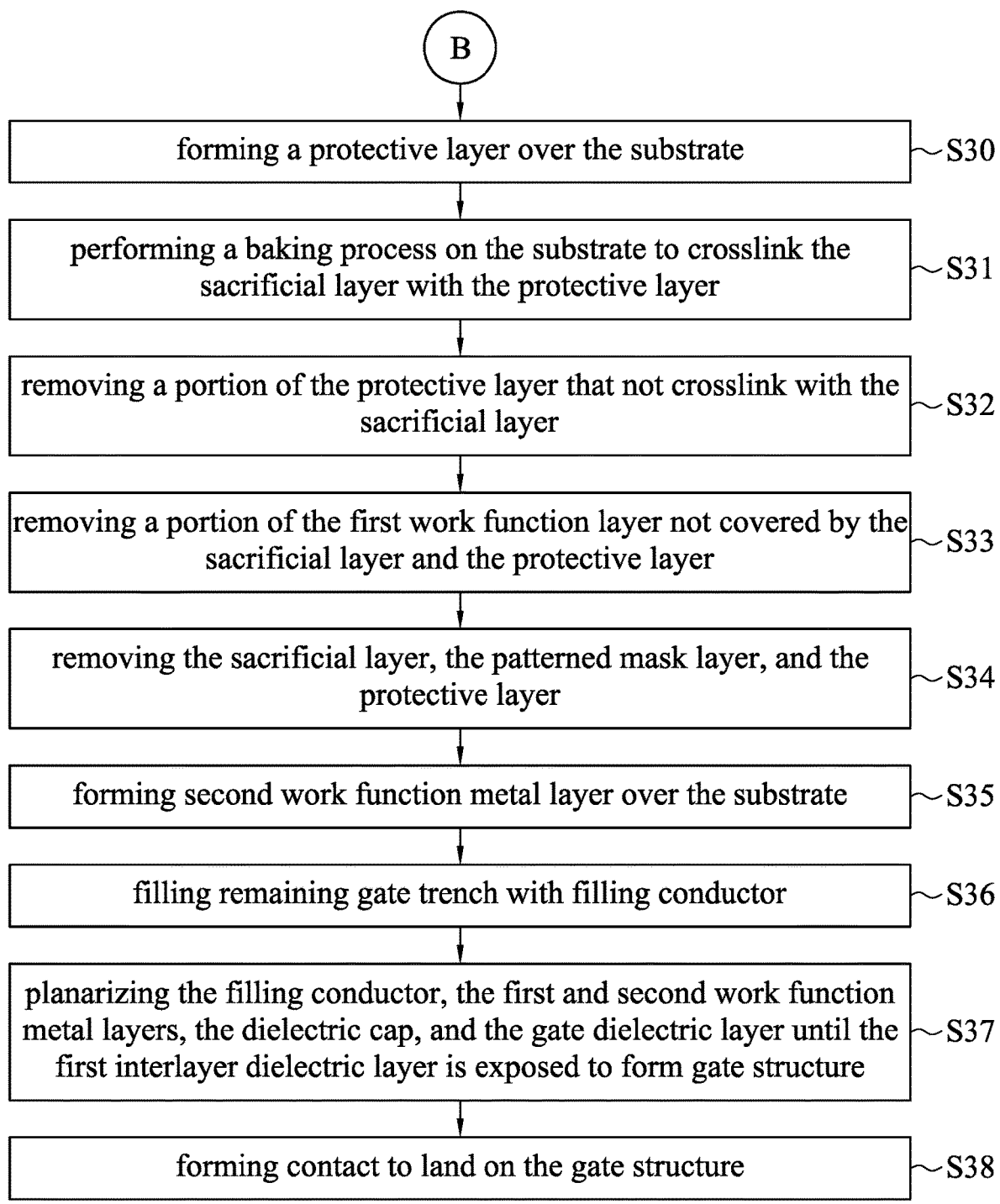

Referring now to FIGS. 1A-1C, illustrated are an exemplary method M for fabrication of a semiconductor device in accordance with some embodiments. The method M includes a relevant part of the entire manufacturing process. It is understood that additional operations may be provided before, during, and after the operations shown by FIGS. 1A-1C, and some of the operations described below can be replaced or eliminated for additional embodiments of the method. The order of the operations/processes may be interchangeable. The method M includes fabrication of a FinFET device. However, the fabrication of FinFET device is merely example for describing the manufacturing process according to some embodiments of the present disclosure.

Figure 2:
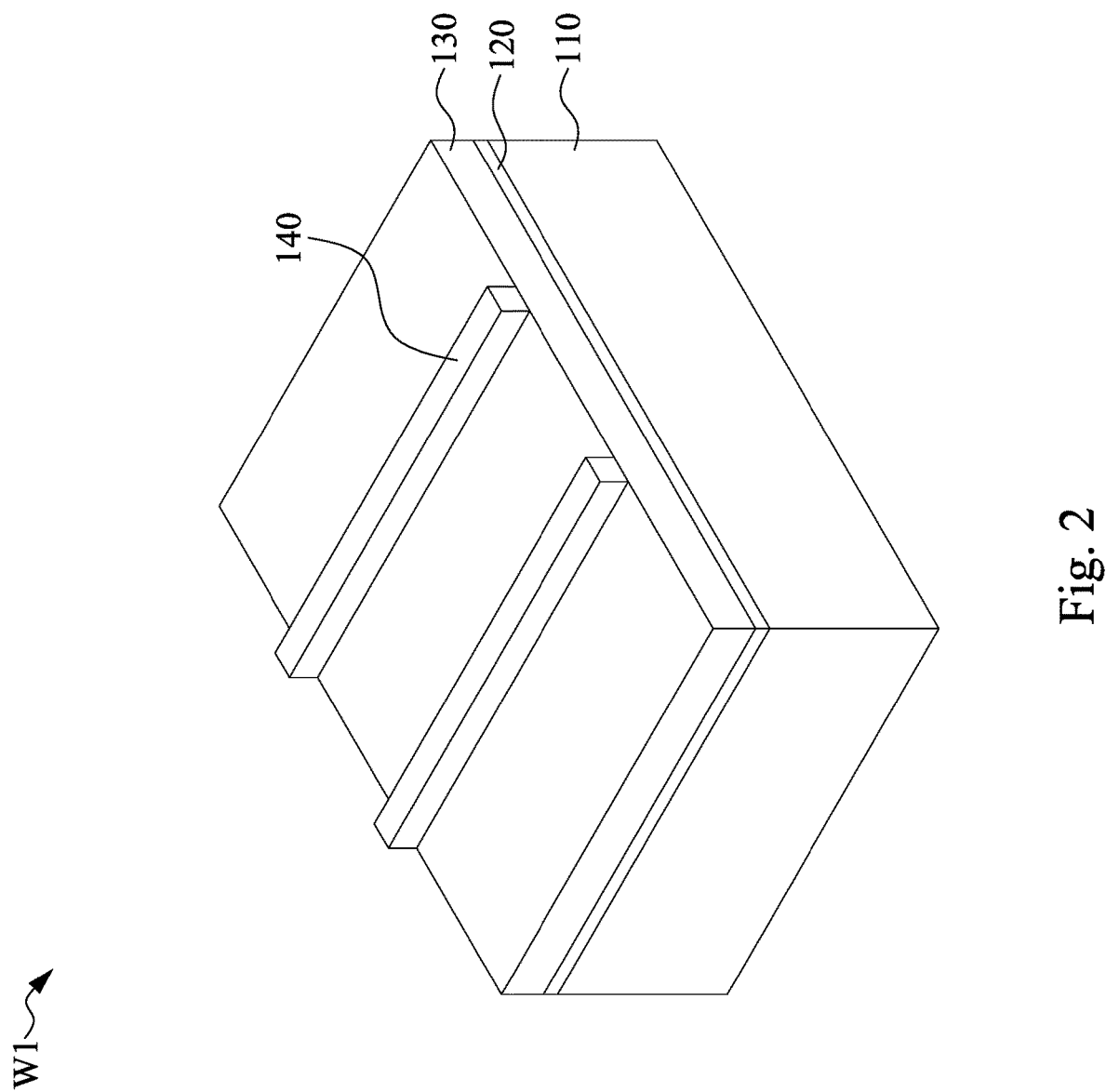
FIGS. 2-16, 17A, and 18-30 illustrate a semiconductor device at various stages of the method in FIGS. 1A-1C according to some embodiments of the present disclosure.

FIGS. 2 to 28 illustrate a wafer W1 at various stages of the method M according to some embodiments of the present disclosure. The method M begins at block S10 where a pad layer, a mask layer and a photoresist layer are formed in sequence over a substrate. Referring to FIG. 2, in some embodiments of block S10, a wafer W1 undergoes a series of deposition and photolithography processes, such that a pad layer 120, a mask layer 130 and a patterned photoresist layer 140 are formed on a substrate 110 of the wafer W1. In some embodiments, the substrate 110 is a semiconductor substrate, such as a bulk semiconductor, a semiconductor-on-insulator (SOI) substrate, or the like. An SOI substrate includes a layer of a semiconductor material formed on an insulator layer. The insulator layer may be, by way of example and not limitation, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 2, a P-type well and an N-type well in the substrate 110 which divide the substrate 110 into separate regions for different types of devices or transistors. Example materials of the P-type well and the N-type well include, but are not limited to, semiconductor materials doped with various types of p-type dopants and/or n-type dopants. In some embodiments, the P-type well includes p-type dopants, and the N-type well includes n-type dopants. In the example configuration in FIG. 2, the N-type well is a region for forming p-channel metal-oxide semiconductor (PMOS) transistors, and the P-type well is a region for forming n-channel metal-oxide semiconductor (NMOS) transistors. The described conductivity of the well regions and herein is an example. Other arrangements are within the scope of various embodiments.

In some embodiments, the pad layer 120 is a thin film including silicon oxide formed using, by way of example and not limitation, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, by way of example and not limitation, using low-pressure chemical vapor deposition (LPCVD) or plasma enhanced chemical vapor deposition (PECVD). The mask layer 130 is used as a hard mask during subsequent photolithography processes. A photoresist layer 140 is formed on the mask layer 130 and is then patterned, forming openings in the photoresist layer 140, so that regions of the mask layer 130 are exposed.

Figure 3:
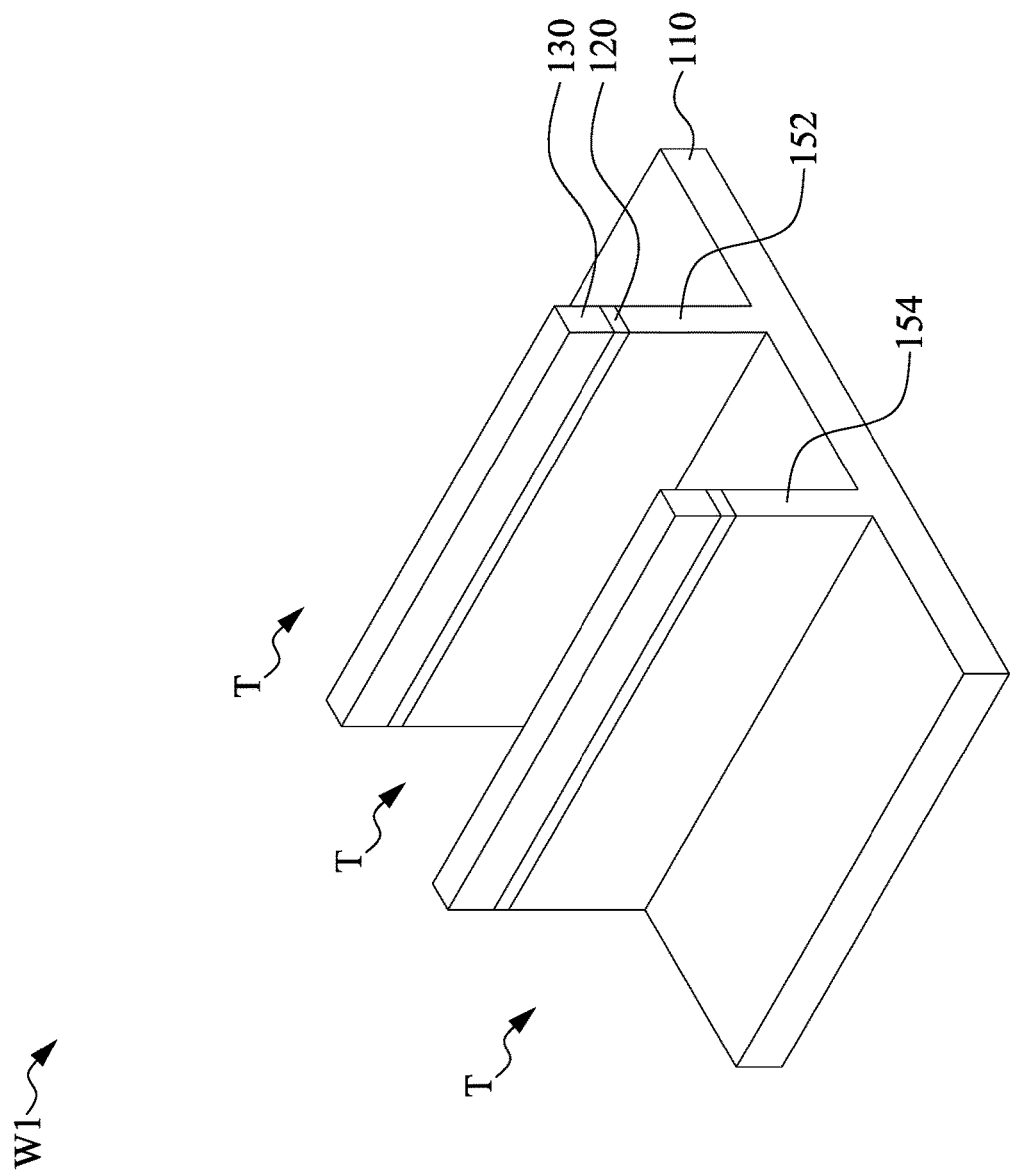

Returning to FIG. 1A, the method M then proceeds to block S11 where the substrate is patterned to form one or more fins. With reference to FIG. 3, in some embodiments of block S11, the mask layer 130 and pad layer 120 are etched through the photoresist layer 140, exposing the underlying P-type well 116 and the underlying N-type well 118. The exposed substrate 110 is then etched, forming trenches T. Portions of the P-type well between neighboring trenches T can be referred to as semiconductor fin 152. Portions of the N-type well between neighboring trenches T can be referred to as semiconductor fin 154. After etching the substrate 110, the photoresist layer 140 is removed. Next, a cleaning step may be optionally performed to remove a native oxide of the semiconductor substrate 110. The cleaning may be performed using diluted hydrofluoric (HF) acid, by way of example and not limitation. According to the various aspects of the present disclosure, the semiconductor fins 152 and 154 extend along a first direction. In some embodiments, the semiconductor fin 152 and 154 may also be referred to as oxide-definition (OD) regions.

Figure 4:
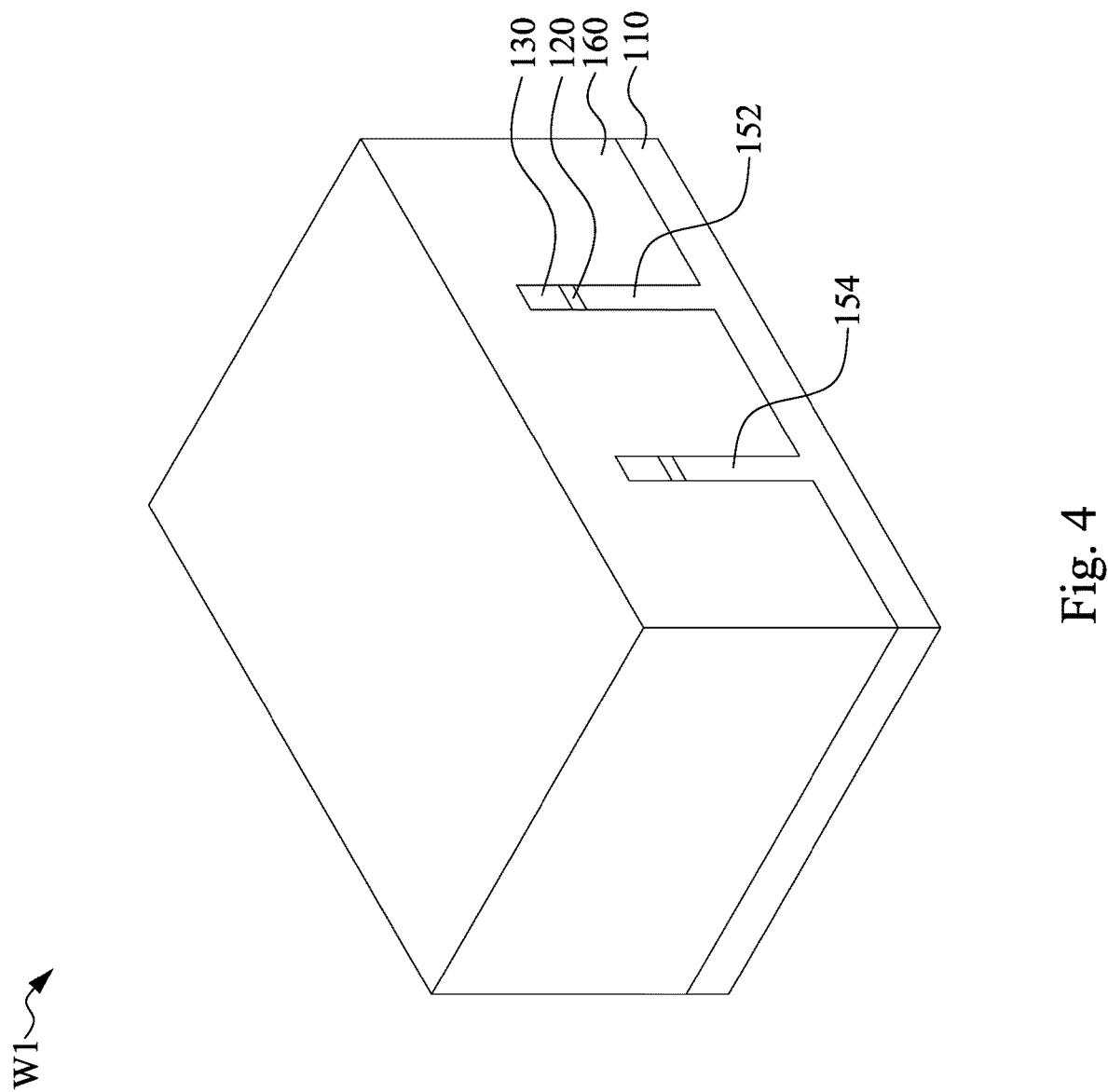

Returning to FIG. 1A, the method M then proceeds to block S12 where an isolation dielectric is formed to cover the fin. With reference to FIG. 4, an isolation dielectric 160 is formed to overfill the trenches T and cover the semiconductor fins 152 and 154. The isolation dielectric 160 in the trenches T can be referred to as a shallow trench isolation (STI) structure. In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), in which process gases may include tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, by way of example and not limitation, a thermal oxide liner layer with silicon nitride formed over the liner. Thereafter, a thermal annealing may be optionally performed to the isolation dielectric 160.

Figure 5:
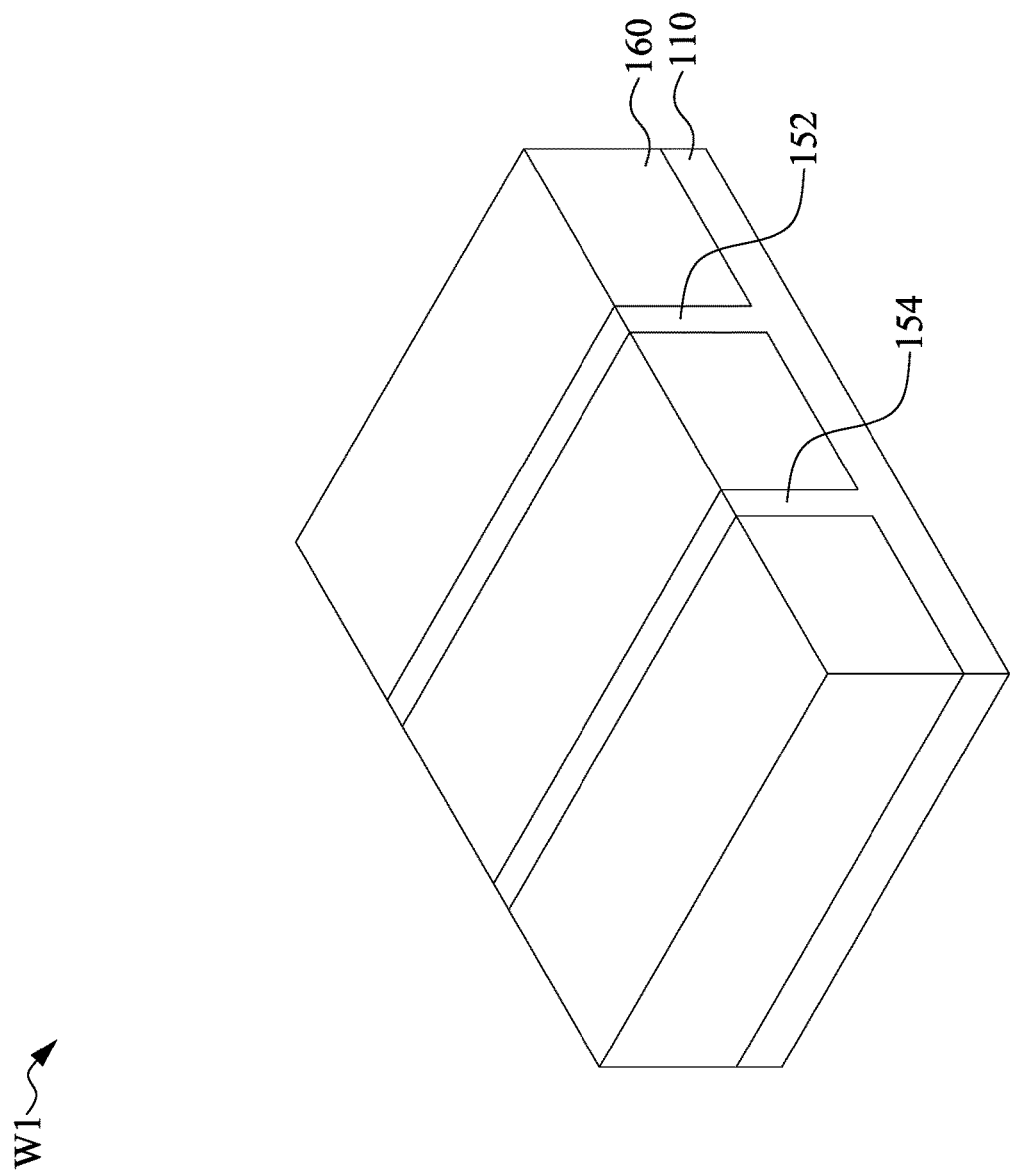

Returning to FIG. 1A, the method M then proceeds to block S13 where a planarization process is performed to the isolation dielectric. With reference to FIG. 5, a planarization process such as chemical mechanical polish (CMP) is performed to remove the excess isolation dielectric 160 over the semiconductor fins 152 and 154. In some embodiments, the planarization process may also remove the mask layer 130 and the pad layer 120 such that top surfaces of the semiconductor fins 152 and 154 are exposed. In some other embodiments, the planarization process stops when the mask layer 130 is exposed. In such embodiments, the mask layer 130 may act as the CMP stop layer in the planarization. If the mask layer 130 and the pad layer 120 are not removed by the planarization process, the mask layer 130, if formed of silicon nitride, may be remove by a wet process using hot $H_3PO_4$, and the pad layer 120, if formed of silicon oxide, may be removed using diluted HF.

Figure 6:
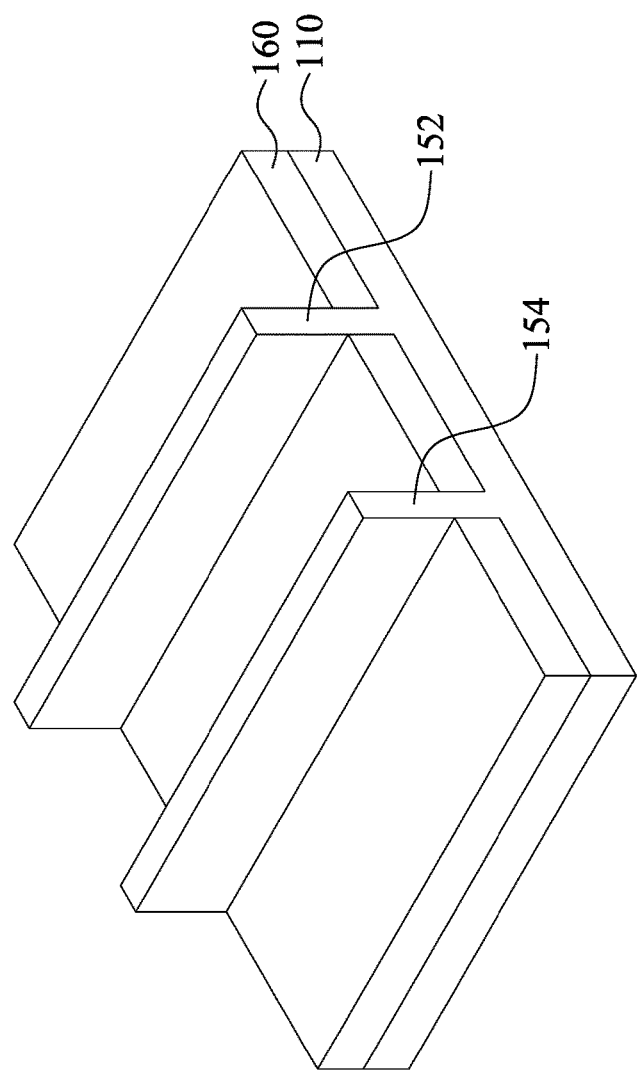

Returning to FIG. 1A, the method M then proceeds to block S14 where the isolation dielectric is recessed. With reference to FIG. 6, the isolation dielectric 160 is recessed, by way of example and not limitation, through an etching operation, in which diluted HF, SiCoNi (including HF and $NH_3$), or the like, may be used as the etchant. After recessing the isolation dielectric 160, a portion of the semiconductor fin 152 and a portion of the semiconductor fin 154 are higher than a top surface of the isolation dielectric 160.

It is understood that the blocks S10-S14 described above are merely an example of how the semiconductor fins 152 and 154 and the STI structure 160 are formed. In other embodiments, a dielectric layer can be formed over a top surface of the substrate 110; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fin. By way of example and not limitation, the semiconductor fins 152 and 154 can be recessed, and a material different from the recessed semiconductor fins 152 and 154 is epitaxially grown in its place. In even further embodiments, a dielectric layer can be formed over a top surface of the substrate 110; trenches can be etched through the dielectric layer; heteroepitaxial structures can be epitaxially grown in the trenches using a material different from the substrate 110; and the dielectric layer can be recessed such that the heteroepitaxial structures protrude from the dielectric layer to form fins. In some embodiments where homoepitaxial or heteroepitaxial structures are epitaxially grown, the grown materials may be in-situ doped during growth, which may obviate prior implanting of the fins although in-situ and implantation doping may be used together. In some embodiments, the semiconductor fin 152 or the semiconductor fin 154 may include silicon germanium ($Si_xGe_{1-x}$, where x can be between approximately 0 and 1), silicon carbide, pure or substantially pure germanium, a III-V compound semiconductor, a II-VI compound semiconductor, or the like. By way of example and not limitation, the available materials for forming III-V compound semiconductor include, but are not limited to, InAs, AlAs, GaAs, InP, GaN, InGaAs, InAlAs, GaSb, AlSb, AlP, GaP, or the like.

As used herein, the term "in-situ" is used to describe processes that are performed while a device or substrate remains within a processing system (e.g., including a load lock chamber, transfer chamber, processing chamber, or any other fluidly coupled chamber), and where by way of example and not limitation, the processing system allows the substrate to remain under vacuum conditions. As such, the term "in-situ" may also be used to refer to processes in which the device or substrate being processed is not exposed to an external environment (e.g., external to the processing system).

Figure 7:
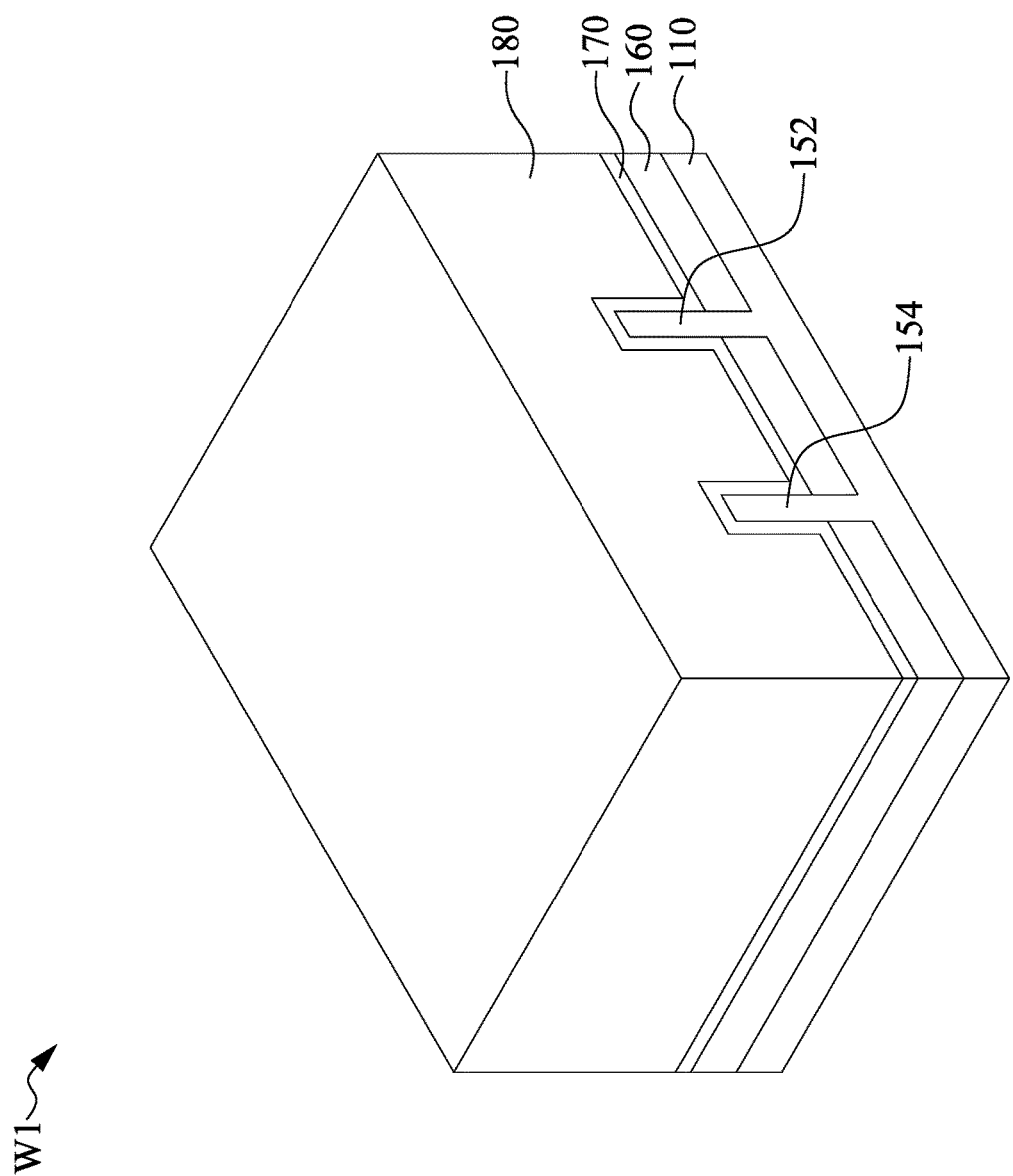

Returning to FIG. 1A, the method M then proceeds to block S15 where a gate dielectric layer and a dummy gate electrode layer are formed in sequence over the fin. With reference to FIG. 7, a gate dielectric layer 170 is blanket formed over the P-type well 116 and the N-type well 118 to cover the semiconductor fins 152 and 154 and the isolation dielectric 160, and a dummy gate electrode layer 180 is formed over the gate dielectric layer 170. In some embodiments, the gate dielectric layer 170 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 170 is an oxide layer. The gate dielectric layer 170 may be formed by a deposition processes, such as chemical vapor deposition (CVD), physical vapor deposition (PVD), atomic layer deposition (ALD), plasma enhanced CVD (PECVD) or other suitable techniques.

In some embodiments, the dummy gate electrode layer 180 may include polycrystalline-silicon (poly-Si), polycrystalline silicon-germanium (poly-SiGe), metallic nitrides, metallic silicides, metallic oxides, or metals. In some embodiments, the dummy gate electrode layer 180 includes a metal-containing material such as TiN, TaN, TaC, Co, Ru, Al, combinations thereof, or multi-layers thereof. The dummy gate electrode layer 180 may be deposited by CVD, physical vapor deposition (PVD), sputter deposition, or other techniques suitable for depositing conductive materials.

Figure 8:
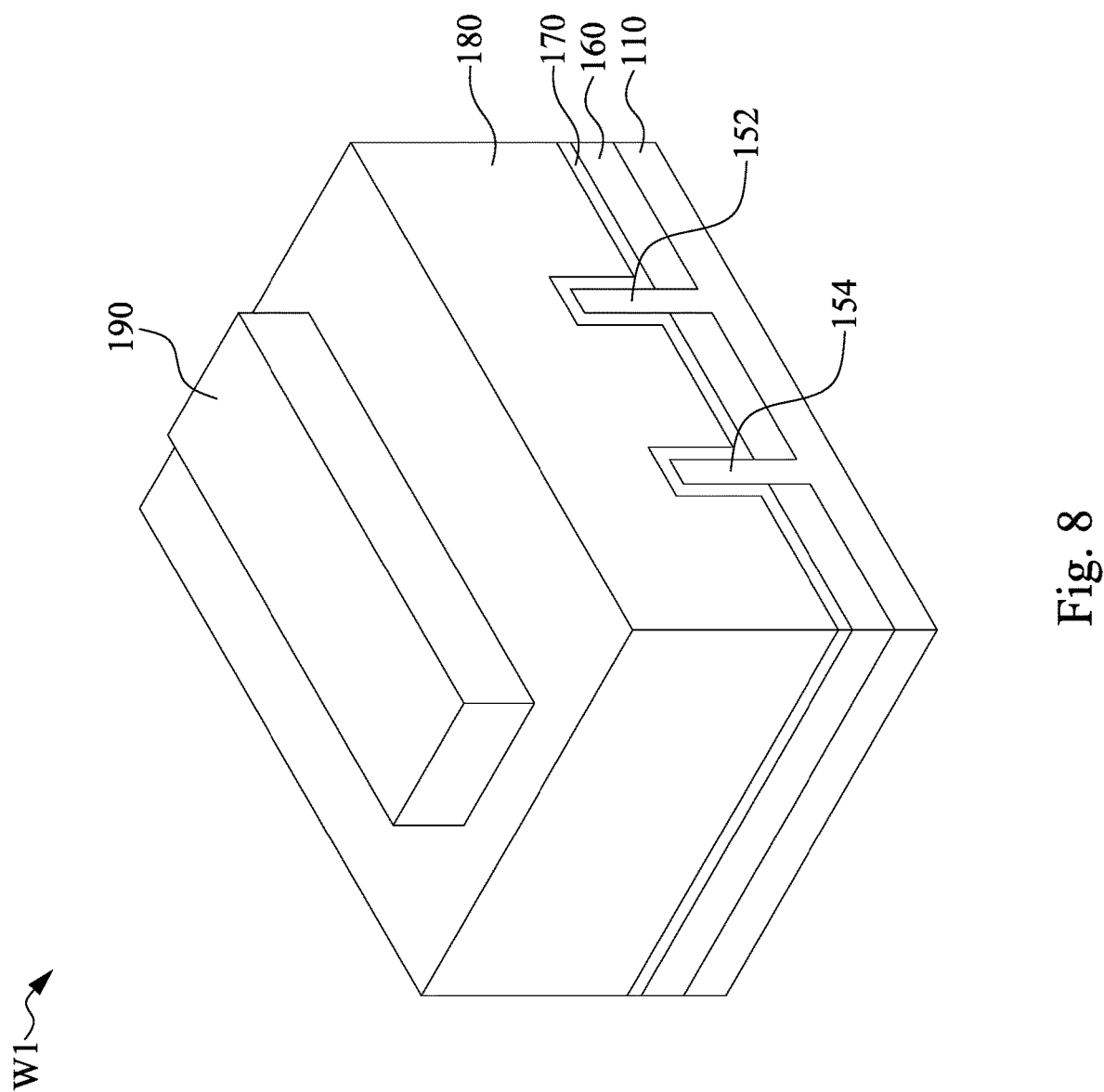

Returning to FIG. 1A, the method M then proceeds to block S16 where a patterned mask layer is formed over the dummy gate electrode layer. With reference to FIG. 8, in some embodiments of block S16, a patterned mask layer 190 is formed over the dummy gate electrode layer 180 and then patterned to form separated mask portions. The patterned mask layer 190 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 9:
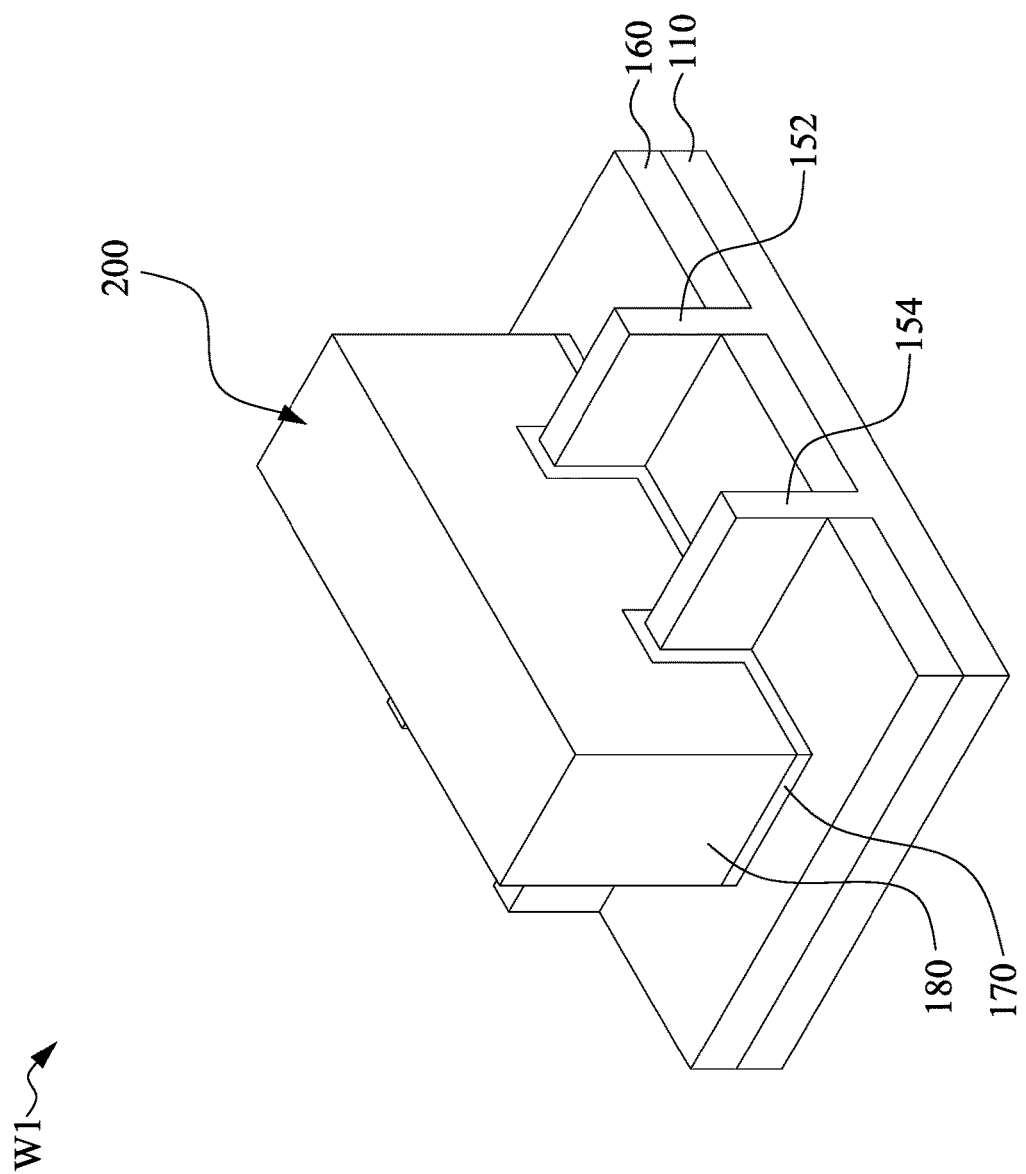

Returning to FIG. 1A, the method M then proceeds to block S17 where the dummy gate electrode layer and the gate dielectric layer are patterned to form dummy gate structure. With reference to FIG. 9, in some embodiments of block S17, one or more etching processes are performed to form dummy gate structure 200 wrapping around the semiconductor fins 152 and 154 using the patterned mask 190 as an etching mask, and the patterned mask layer 190 is removed after the etching. The dummy gate structure includes a gate dielectric layer 170 and a dummy gate electrode layer 180 over the gate dielectric layer 170. The dummy gate structures 200 have substantially parallel longitudinal axes that are substantially perpendicular to a longitudinal axis of the semiconductor fins 152 and 154. The dummy gate structure 200 will be replaced with a replacement gate structure using a "gate-last" or replacement-gate process.

Figure 10:
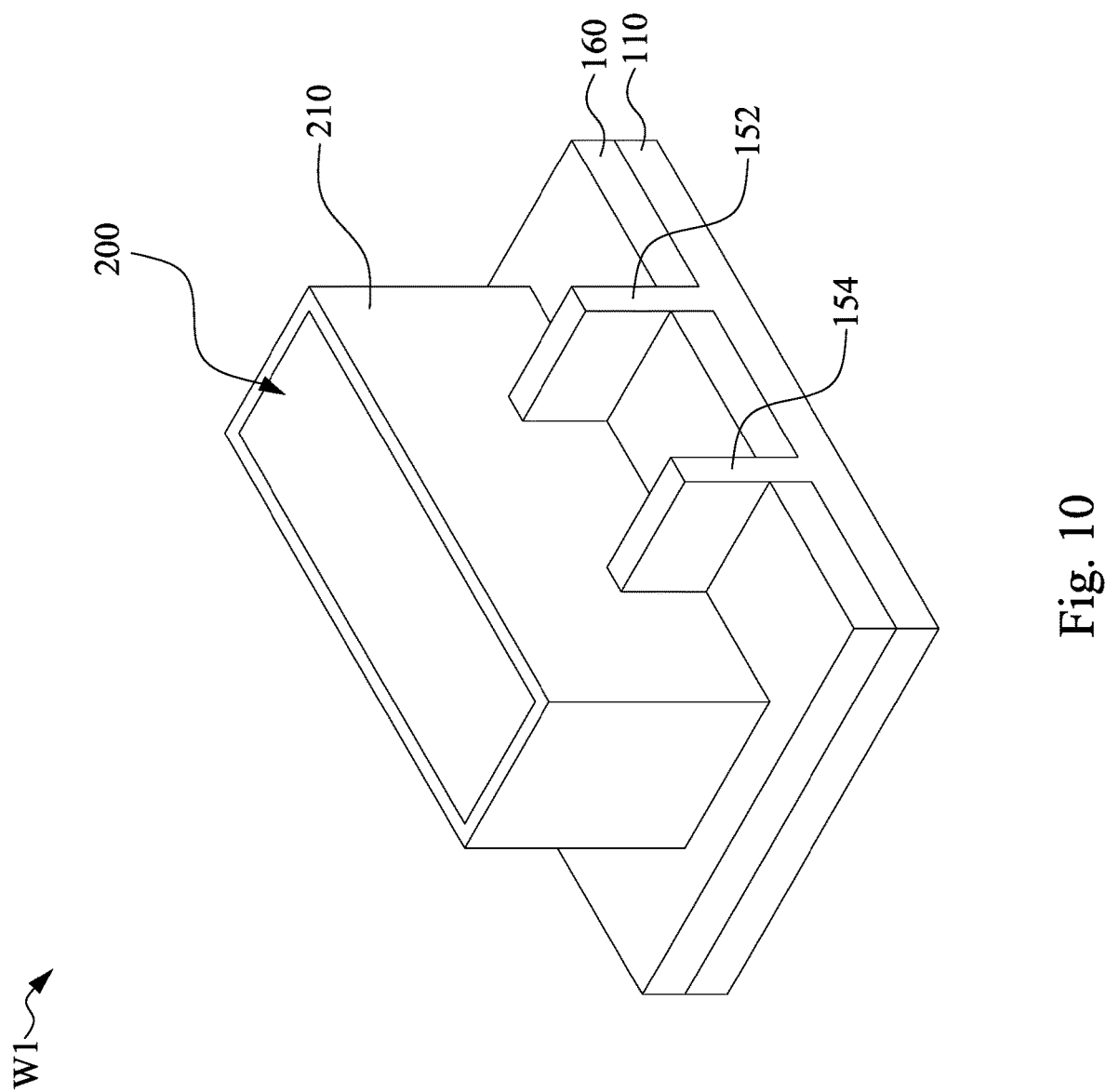

Returning to FIG. 1A, the method M then proceeds to block S18 where gate spacers are formed along sidewalls of the dummy gate structure. With reference to FIG. 10, in some embodiments of block S18, a gate spacer 210 is formed along sidewalls of the dummy gate structures 200. In some embodiments, the gate spacer 210 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacer 210 may include a single layer or multilayer structure made of different dielectric materials. The method of forming the gate spacers 210 includes blanket forming a dielectric layer on the structure shown in FIG. 9 using, by way of example and not limitation, CVD, PVD or ALD, and then performing an etching process such as anisotropic etching to remove horizontal portions of the dielectric layer. The remaining portions of the dielectric layer on sidewalls of the dummy gate structure 200 can serve as the gate spacer 210. In some embodiments, the gate spacer 210 may be used to offset subsequently formed doped regions, such as source/drain regions. The gate spacer 210 may further be used for designing or modifying the source/drain region profile.

Figure 11:
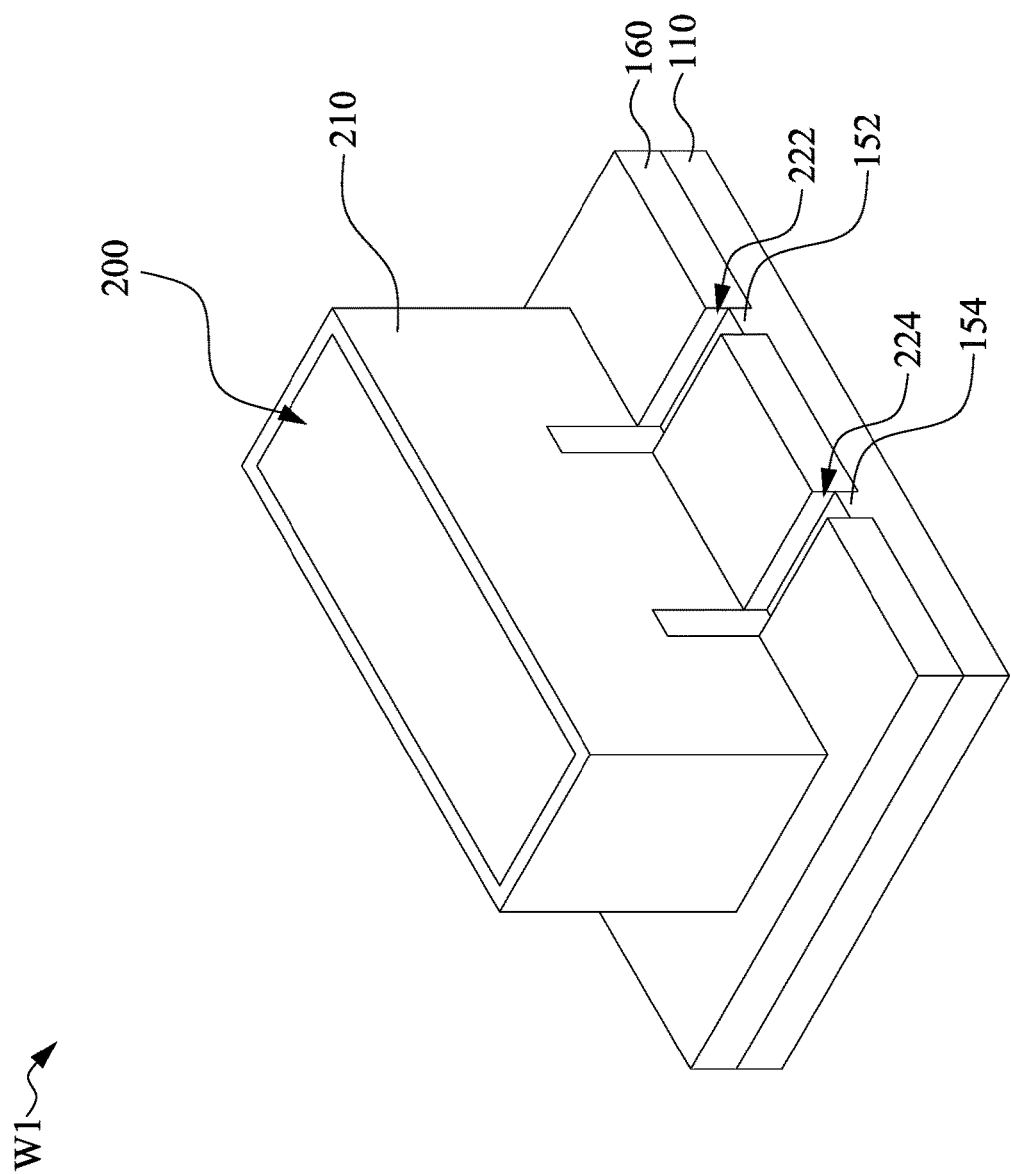

Referring to FIG. 1A, the method M then proceeds to block S19 where source/drain recesses are formed into the fin. With reference to FIG. 11, in some embodiments of block S19, portions of the semiconductor fins 152 and 154 not covered by the dummy gate structure 200 and the gate spacer 210 are recessed to form recesses 222 and 224. In some embodiments, formation of the recesses 222 and 224 may include a dry etching process, a wet etching process, or combination dry and wet etching processes. This etching process may include reactive ion etch (RIE) using the dummy gate structures 200 and gate spacers 210 as masks, or by any other suitable removal process. After the etching process, a pre-cleaning process may be performed to clean the recesses 222 and 224 with hydrofluoric acid (HF) or other suitable solution in some embodiments.

Figure 12:
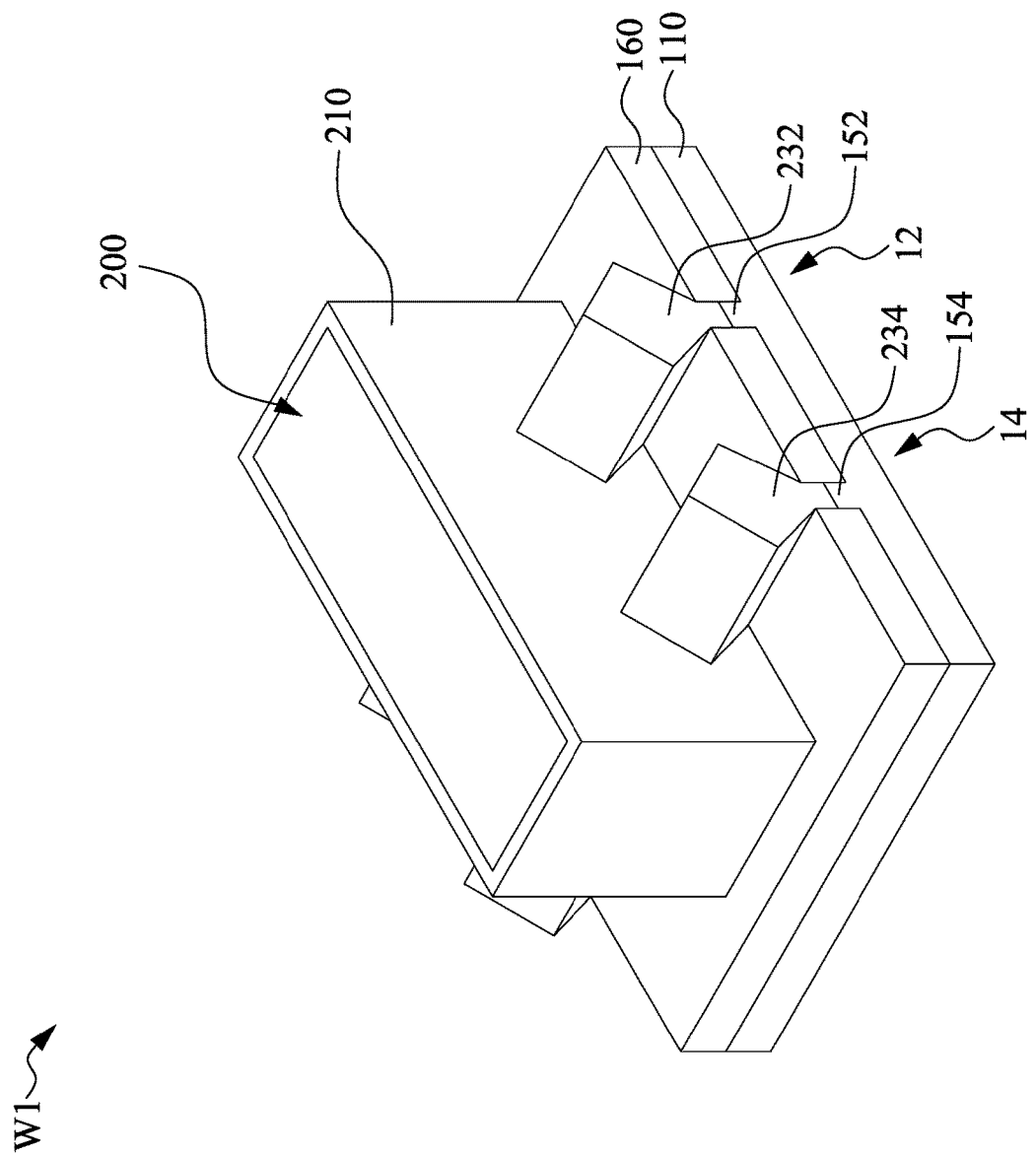

Returning to FIG. 1B, the method M then proceeds to block S20 where source/drain structures are formed into the recesses. With reference to FIG. 12, in some embodiments of block S20, epitaxial source/drain structures 232 and 234 are respectively formed in the recesses 222 and 224 (see FIG. 11) to form an n-channel metal-oxide semiconductor (NMOS) transistor 12 and a p-channel metal-oxide semiconductor (PMOS) transistor 14. In some embodiments, stress may enhance carrier mobility and performance of the MOS.

As shown in FIG. 12, the epitaxial source/drain structures 232 and 234 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 152 and 154. The epitaxial source/drain structures 232 and 234 can be formed in different epitaxy processes. The epitaxial source/drain structures 232 and 234 may include semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial source/drain structures 232 and 234 have suitable crystallographic orientation (e.g., a (100), (110), or (111) crystallographic orientation). In some embodiments, lattice constants of the epitaxial source/drain structures 232 and 234 are different from that of the semiconductor fins 152 and 154, so that the channel region between the epitaxial source/drain structures 232 and 234 can be strained or stressed by the epitaxial source/drain structures 232 and 234 to improve carrier mobility of the semiconductor device and enhance the device performance.

In some embodiments, the epitaxial source/drain structure 232 is an n-type epitaxy structure, and the epitaxial source/drain structure 234 is a p-type epitaxy structures. The epitaxial source/drain structure 232 may include SiP, SiC, SiPC, Si, III-V compound semiconductor materials or combinations thereof, and the pitaxial source/drain structure 234 may include SiGe, SiGeC, Ge, Si, III-V compound semiconductor materials, or combinations thereof. During the formation of the epitaxial source/drain structure 232, n-type impurities such as phosphorous or arsenic may be doped with the proceeding of the epitaxy. By way of example and not limitation, when the epitaxial source/drain structure 232 includes SiC or Si, n-type impurities are doped. Moreover, during the formation of the epitaxial source/drain structure 234, p-type impurities such as boron or $BF_2$ may be doped with the proceeding of the epitaxy. By way of example and not limitation, when the epitaxial source/drain structure 234 includes SiGe, p-type impurities are doped.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 152 and 154 (e.g., silicon, silicon germanium, silicon phosphate, or the like). The epitaxial source/drain structures 232 and 234 may be in-situ doped. The doping species include p-type dopants, such as boron or $BF_2$; n-type dopants, such as phosphorus or arsenic; and/or other suitable dopants including combinations thereof. If the epitaxial source/drain structures 232 and 234 are not in-situ doped, a second implantation process (i.e., a junction implant process) is performed to dope the epitaxial source/drain structures 232 and 234. One or more annealing processes may be performed to activate the epitaxial source/drain structures 230. The annealing processes include rapid thermal annealing (RTA) and/or laser annealing processes.

Figure 13:
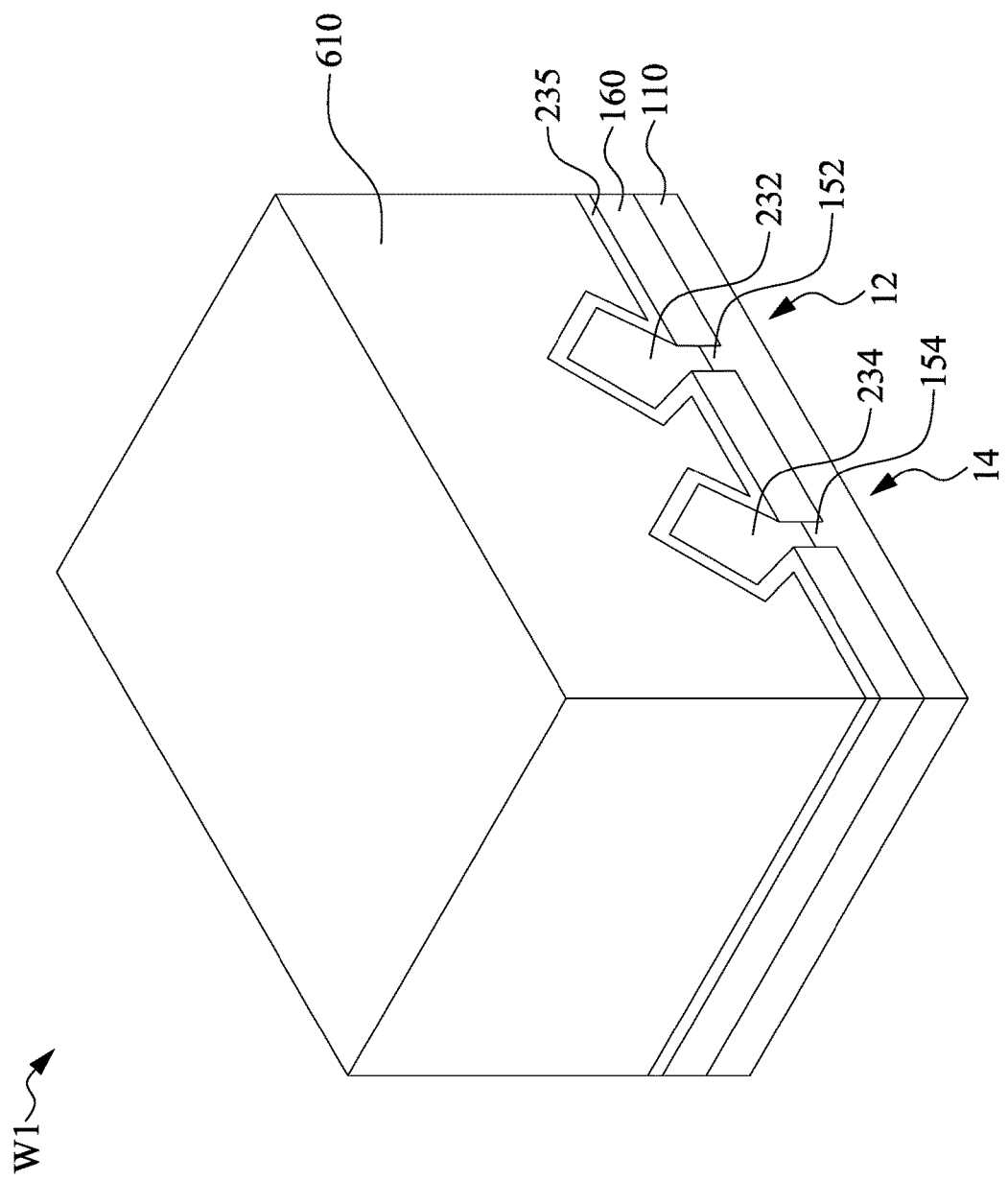

Referring to FIG. 1B, the method M then proceeds to block S21 where a contact etch stop layer (CESL) and a first interlayer dielectric (ILD) layer is formed over the source/drain structures. With reference to FIG. 13, in some embodiments of block S21, a CESL 235 is formed over the source/drain structures 230, the dummy gate structures 200 and the gate spacers 210, and an ILD layer 610 is formed over the CESL 235, followed by performing a CMP process to remove excessive material of the ILD layer 610 and CESL 235 to expose the dummy gate structures 200. The CMP process may planarize a top surface of the ILD layer 610 with top surfaces of the dummy gate structures 200 and gate spacers 210. In some embodiments, the ILD layer 610 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 610 may be formed using, by way of example and not limitation, CVD, ALD, spin-on-glass (SOG) or other suitable techniques. In some embodiments, the CESL 235 includes silicon nitride, silicon oxynitride or other suitable materials. The CESL 235 can be formed using, by way of example and not limitation, plasma enhanced CVD, low pressure CVD, ALD or other suitable techniques.

Figure 14:
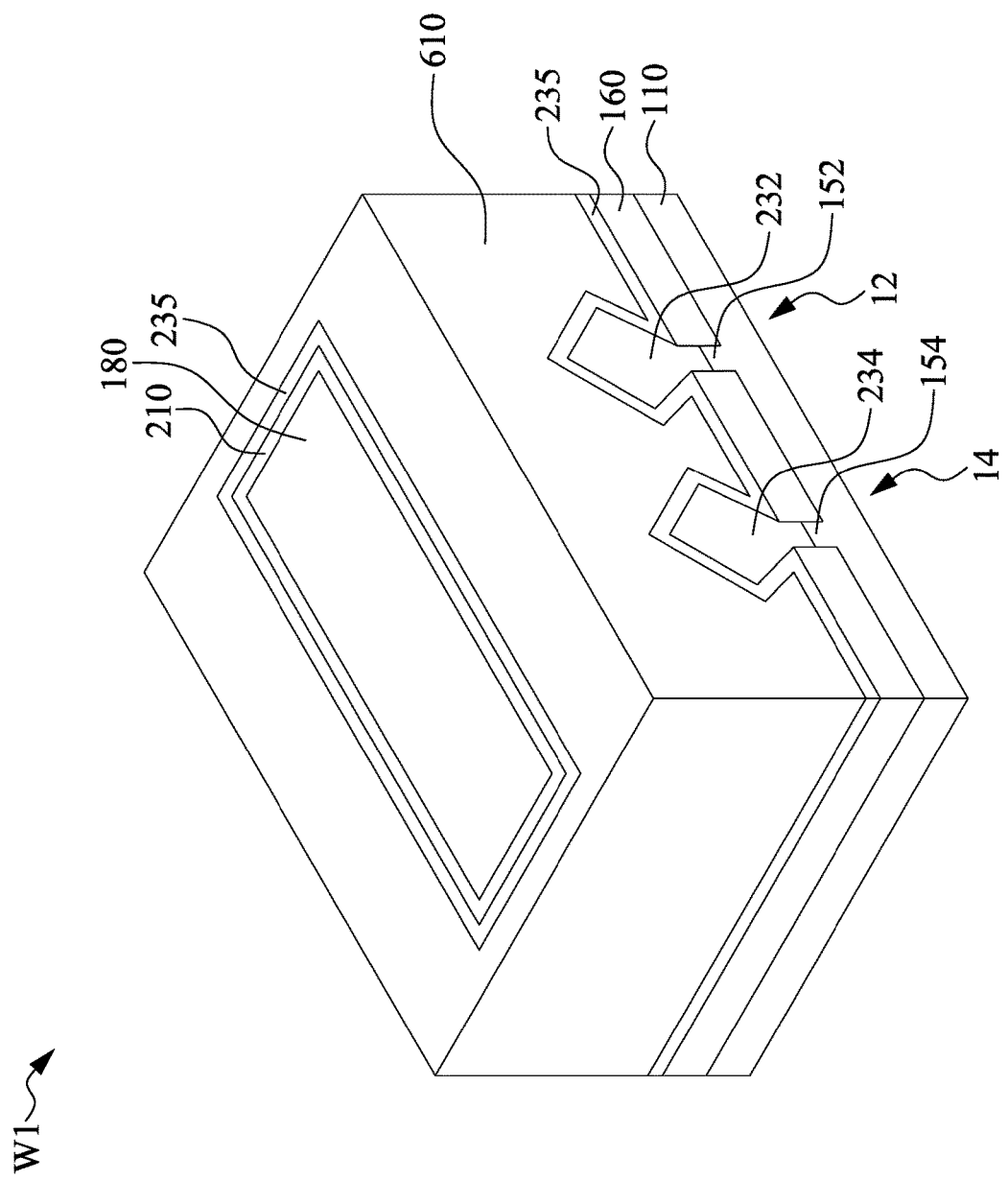

Referring to FIG. 1B, the method M then proceeds to block S22 where the first ILD layer is planarized until the dummy gate structure is exposed. With reference to FIG. 14, in some embodiments of block S22, a planarization process such as chemical mechanical polish (CMP) is performed to remove a portion of the ILD layer 610 and the CESL 235 above a top surface of the dummy gate structure 200 and/or a top surface of the gate spacer 210, such that the top surface of the dummy gate structure 200 and/or the top surface of the gate spacer 210 is exposed.

Figure 15:
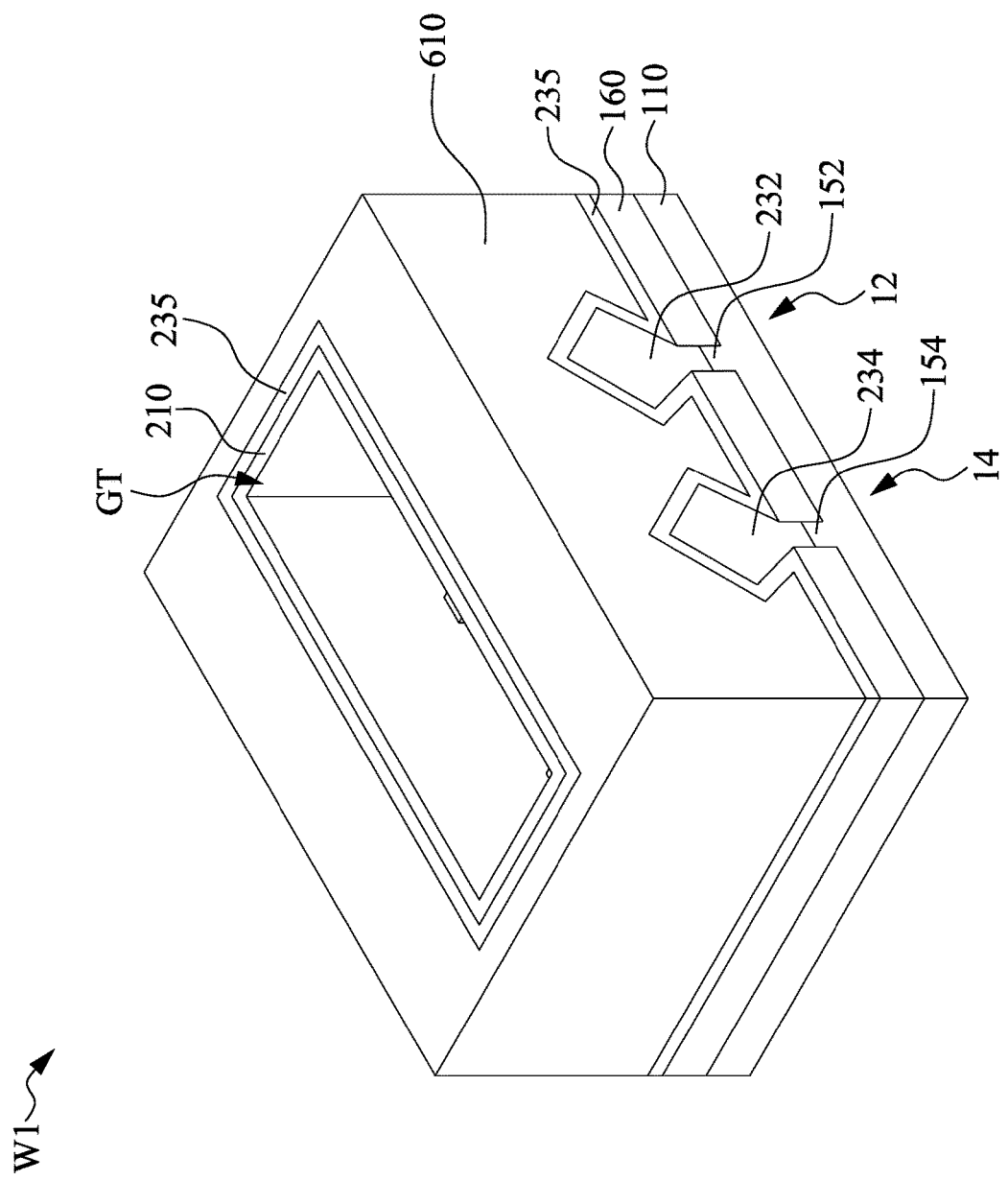

Referring to FIG. 1B, the method M then proceeds to block S23 where the dummy gate structure is removed to form gate trench. With reference to FIG. 15, in some embodiments of block S23, the dummy gate structure 200 (as shown in FIG. 13) is removed to form gate trenches GT with the gate spacer 210 as its sidewall. A width of the gate trenches GT is associated with the dummy gate structure 200.

In some embodiments, the dummy gate structure 200 is removed by performing a first etching process and performing a second etching process after the first etching process. In some embodiments, the dummy gate electrode layer 180 (as shown in FIG. 13) is mainly removed by the first etching process, and the gate dielectric layer 170 (as shown in FIG. 13) is mainly removed by the second etching process that employs a different etchant than that used in the first etching process. In some embodiments, the dummy gate electrode layer 180 is removed, while the gate dielectric layer 170 remains in the gate trenches GT.

In some embodiments, the removal process may include one or more etch processes. By way of example and not limitation, in embodiments in which the dummy gate electrode layer 180 (as shown in FIG. 9) includes polysilicon and the gate dielectric layer 170 (as shown in FIG. 9) includes silicon oxide. The removal process may include selectively etching using either dry or wet etching. In this example, the dummy gate electrode layer 180 may be removed using a dry etch with a process gas including CF4, CHF3, NF3, SF6, Br2, HBr, Cl2, or combinations thereof. Diluting gases such as N2, O2, or Ar may optionally be used. In the case wet etching is used to remove the dummy gate electrode layer 180, the chemicals may include $NH_4OH$: $H_2O_2$:$H_2O$ (APM), $NH_2OH$, KOH, $HNO_3$:$NH_4F$:$H_2O$, and/or the like. The gate dielectric layer 170 may be removed using a wet etch process, such as a diluted HF acid. Other processes and materials may be used.

Figure 16:
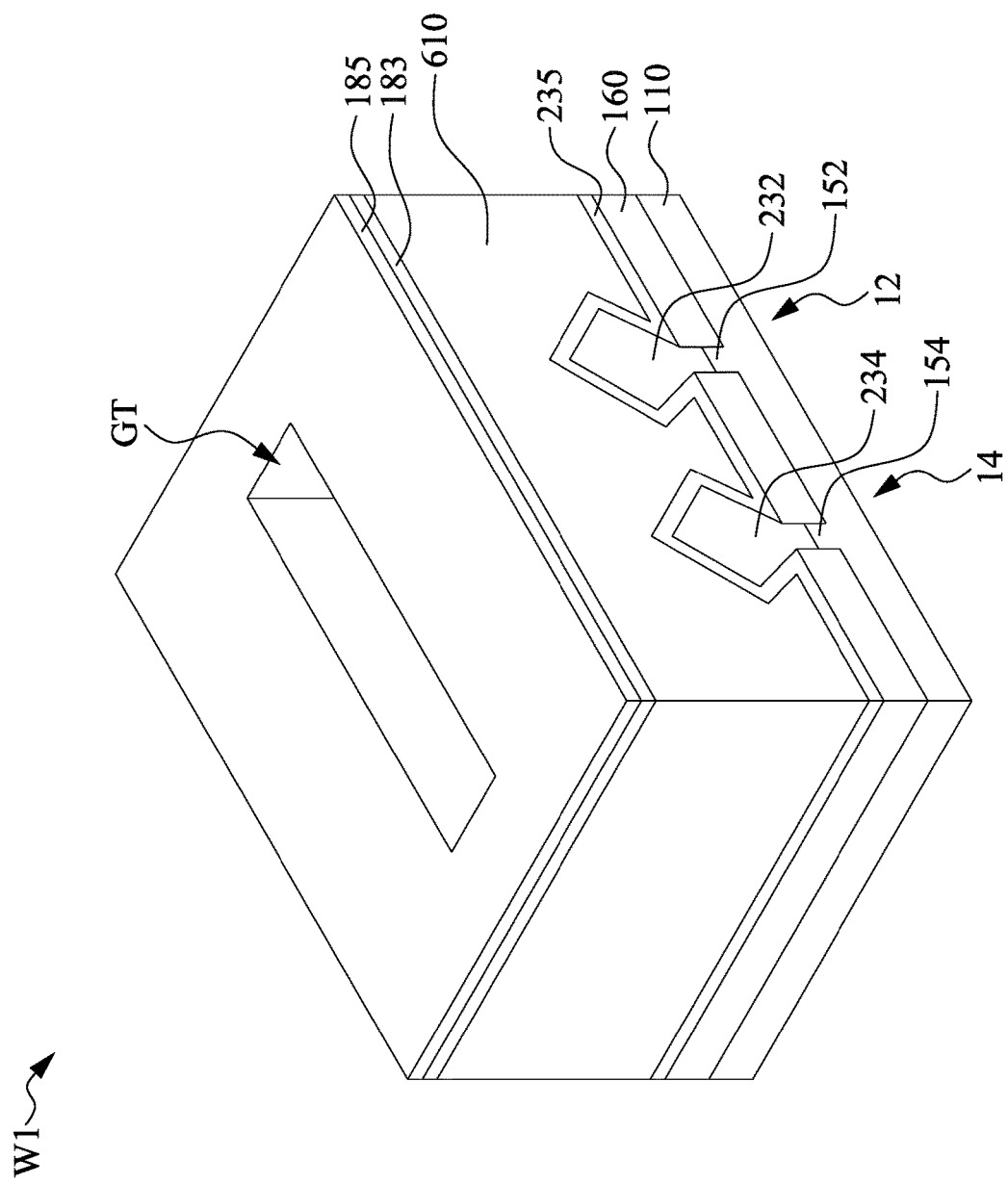

Referring to FIG. 1B, the method M then proceeds to block S24 where a gate dielectric layer and a capping layer are formed in the gate trench. With reference to FIG. 16, in some embodiments of block S24, a gate dielectric layer 183 is formed on the isolation dielectric 160 within the gate trench GT. When the gate dielectric layer 183 is formed, it may cover the isolation dielectric 160 within the gate trench GT. It may also extend vertically along the gate spacer 210 along the entire vertical side surfaces of the gate spacer 210.

In some embodiments, suitable materials for the gate dielectric layer 183 are commonly characterized by their dielectric constant (k) relative to silicon oxide. The gate dielectric layer 183 may include a high-k dielectric material such as $HfO_2$, HfSiO, HfSiON, HfTaO, HfTiO, HfZrO, zirconium oxide ($ZrO_2$), lanthanum oxide ($La_2O_3$), titanium oxide ($TiO_2$), yttrium oxide ($Y_2O_3$), strontium titanate (SrTiO$_3$), aluminum oxide, hafnium dioxide-alumina ($HfO_2$—$Al_2O_3$) alloy, other suitable high-k dielectric materials, and/or combinations thereof. Additionally or in the alternative, the gate dielectric layer 183 may include other dielectrics such as silicon dioxide, silicon nitride, silicon oxynitride, silicon carbide, amorphous carbon, tetraethylorthosilicate (TEOS), other suitable dielectric material, and/or combinations thereof. In some embodiments, the gate dielectric layer 183 may be formed by any suitable technique, such as CVD, ALD, Plasma Enhanced CVD (PE CVD), or Plasma Enhanced ALD (PEALD).

In FIG. 16, a capping layer 185 is formed on the gate dielectric layer 183 within the gate trench GT. The capping layer 185 may cover the horizontal surfaces of the gate dielectric layer 183 as well as the vertical surfaces of the gate dielectric layer 183 that extend vertically along the gate spacer 210. In some embodiments, the capping layer 185 may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition process. In some embodiments, the capping layer 185 includes TaSiN, TaN, or TiN.

Figure 17A:
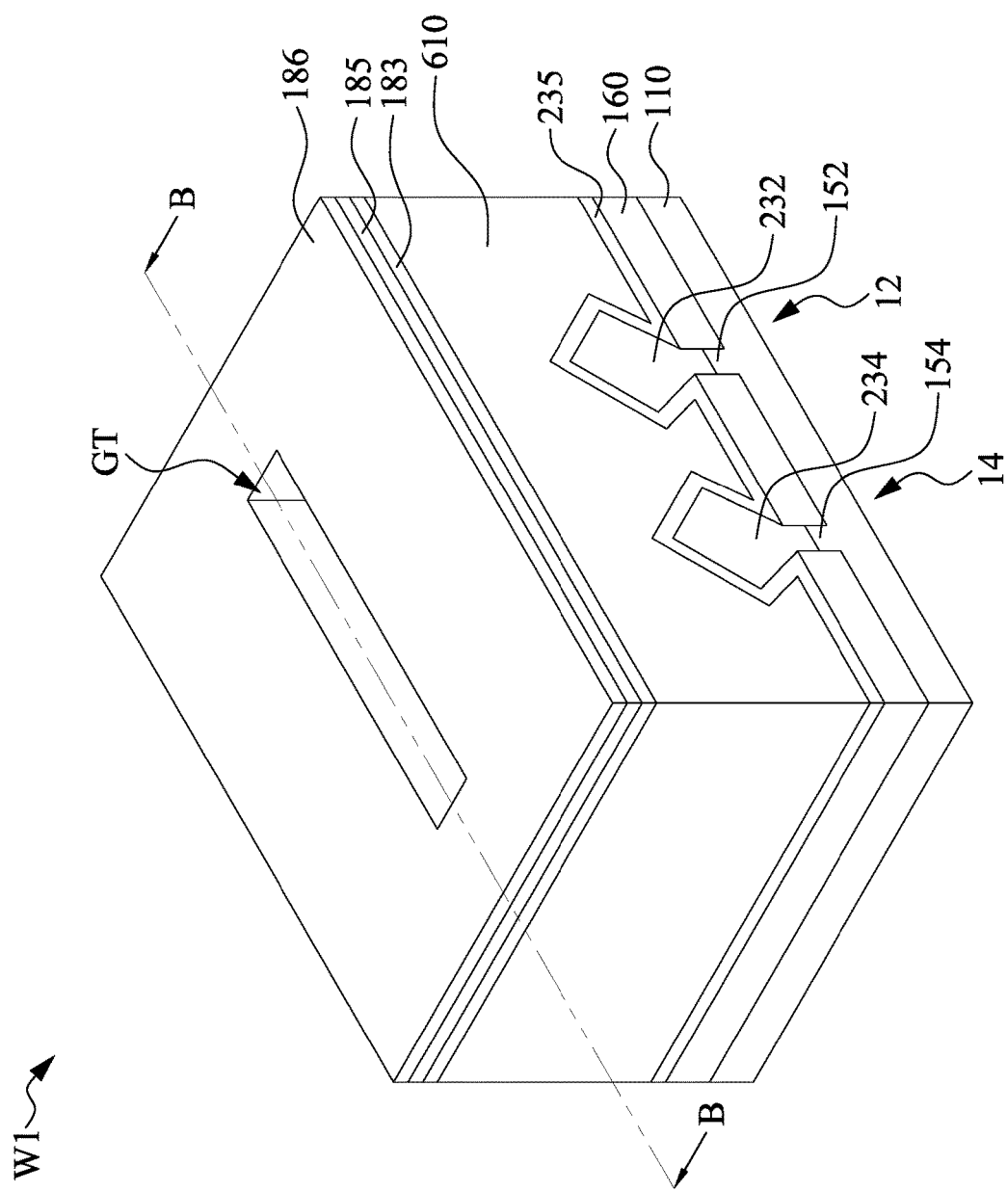

Referring to FIG. 1B, the method M then proceeds to block S25 where a work function metal layer is formed in the gate trench. With reference to FIGS. 17A and 17B, in some embodiments of block S25, a work function metal layer 186 can be conformally formed on the gate dielectric layer 183 and the capping layer 185. A portion of the work function metal layer 186 is formed in the gate trench GT and wraps the semiconductor fins 152 and 154. The work function metal layer 186 can provide a suitable work function value for a gate stack of a semiconductor device, so as to benefit tuning the threshold voltage of the semiconductor device.

In some embodiments, the work function metal layer 186 may include tantalum nitride (TaN). In some other embodiments, an additional structure, such as a titanium nitride layer, may be formed on the gate dielectric layer 185, and the work function metal layer 186 is formed on the additional layer. The work function metal layer 186 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the term "work function" refers to the minimum energy (usually expressed in electron volts) needed to remove an electron from a neutral solid to a point immediately outside the solid surface (or energy needed to move an electron from the Fermi energy level into vacuum). Here "immediately" means that the final electron position is far from the surface on the atomic scale but still close to the solid surface on the macroscopic scale.

Figure 18:
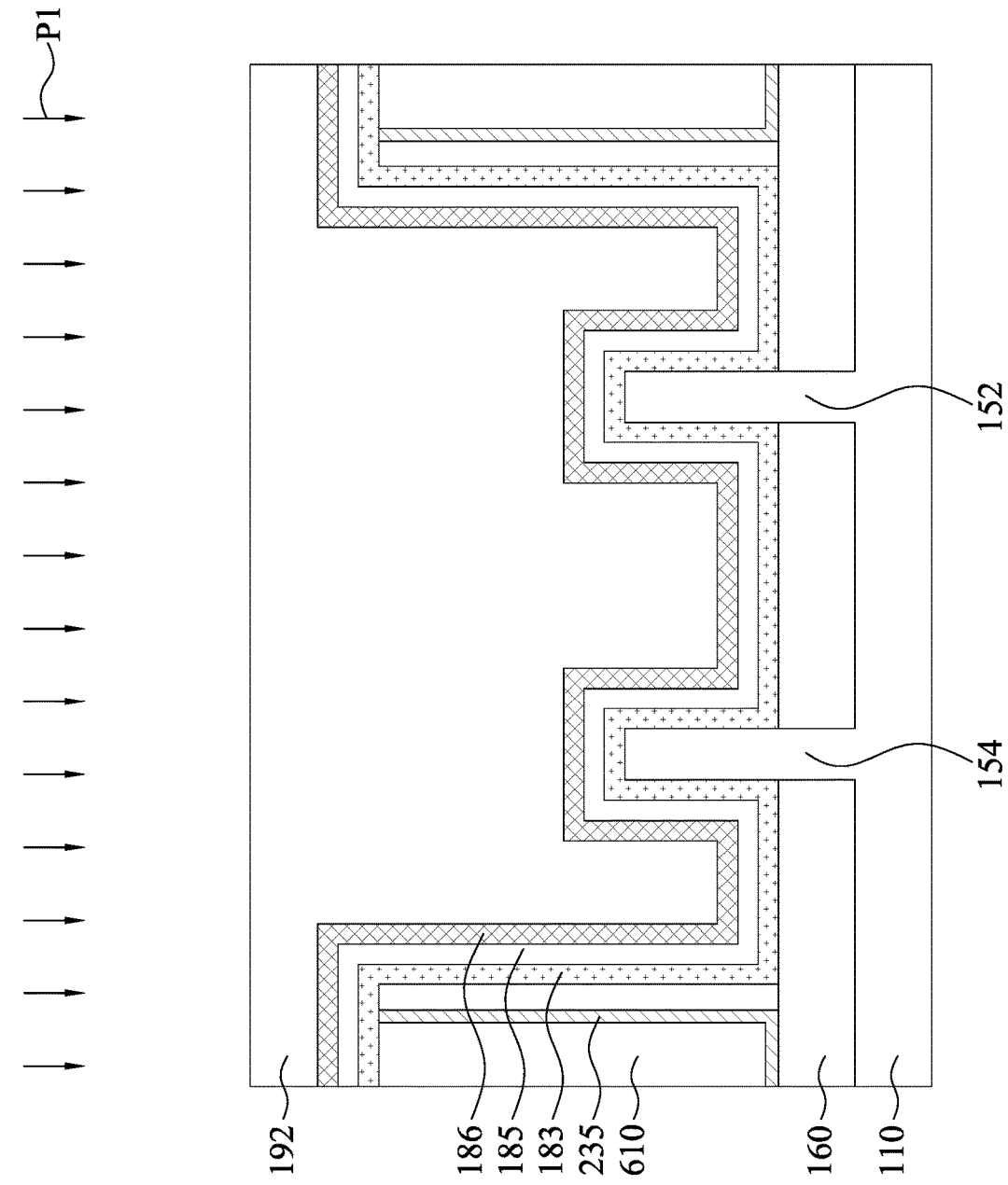

Referring to FIG. 1B, the method M then proceeds to block S26 where a sacrificial layer is formed over the first work function metal layer. With reference to FIG. 18, in some embodiments of block S26, a sacrificial layer 192 is formed over the first work function metal layer 186. By way of example and not limitation, the sacrificial layer 192 may be formed of a bottom antireflective coating (BARC). In greater detail, applying an anti-reflective coating (ARC) composition over the substrate 110, and then the ARC is cured using a process P1, such as radiation by an ultraviolet (UV) light or baking at certain temperature to form the sacrificial layer 192.

Specifically, the ARC composition includes a polymer, a least one thermal acid generator (TAG), and an optional crosslinker. The polymer includes a polymer backbone, a crosslinkable group, and a chromophore for absorbing a radiation in the upcoming lithography patterning process. The ARC composition is dissolved in a solvent as a mixture. In some embodiments, the dissolved ARC composition is applied onto the substrate 110 by a spin coating process.

In some embodiments, the polymer includes about 35% to about 95% by weight of the ARC composition. In some embodiments, the thermal acid generator includes about over 0.05% by weight of the ARC composition. In some embodiments, the ARC composition further includes a crosslinker for linking the polymer in a curing process. To further this embodiment, the crosslinker includes less than about 60% by weight of the ARC composition. In alternative embodiments, the polymer can form crosslinks by itself, in which case a crosslinker is not required.

In FIG. 18, after applying the ARC composition over the substrate 110, the ARC composition crosslinks (or be cured) to form an ARC layer (which may refer to as the sacrificial layer 192). The crosslinking reaction causes the polymers to connect with each other through either the crosslinkable groups of the polymers and/or through the optional crosslinker. The crosslinking reaction may further drive out the solvent. As a result, the ARC composition solidifies and becomes the dense ARC layer (which may refer to as the sacrificial layer 192). In some embodiments, the crosslinking reaction can be effectuated by radiating the ARC composition with an ultraviolet (UV) radiation, such as from about 10 nm to about 400 nm. This may be performed at room temperature. In some embodiments, the ARC composition includes an epoxy crosslinker and the crosslinking reaction can be effectuated at a low temperature in the absence of an acid. In some embodiments, the ARC composition includes two thermal acid generators, one (which may be referred to as a first thermal acid generator thereafter) is responsible for generating a first acid for crosslinking reaction associated with the polymer inside the ARC composition at a first temperature and another (which may be referred to as a second thermal acid generator thereafter) is responsible for generating a second acid for crosslinking reaction associated with the polymer in the sacrificial layer 192 and a protective layer 196 (may also refer to as a bonding layer) which will be formed thereafter shown in FIG. 22 at a second temperature. In some embodiments, the second thermal acid generator is different from the first thermal acid generator.

Figure 22:
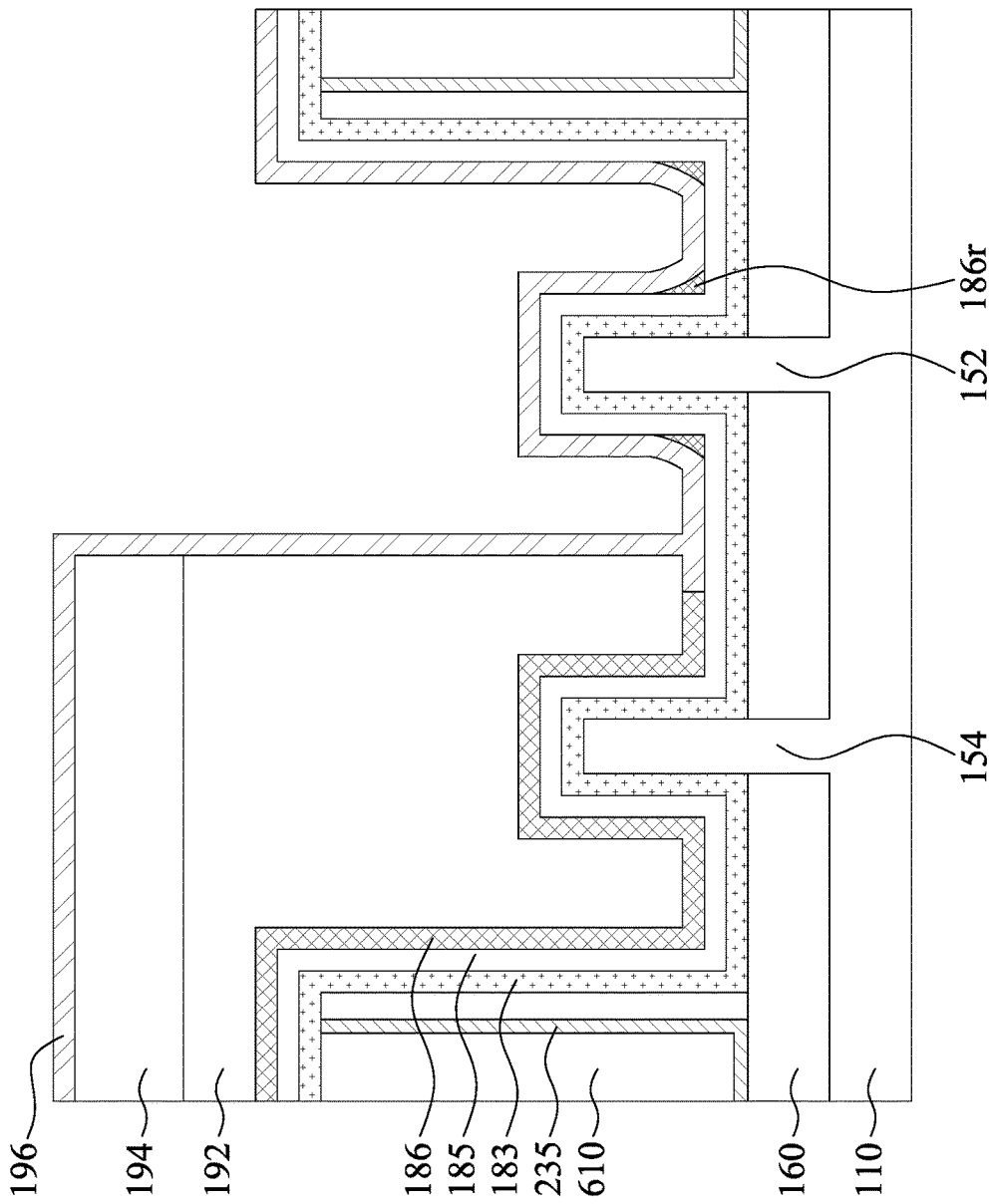

In FIG. 18, the crosslinking reaction includes baking the ARC composition at a temperature that is sufficient to trigger the generation of the first acid but not enough to trigger the generation of the second acid. In some embodiments, the crosslinking reaction is performed at a temperature that is lower than what is needed to trigger the generation of the second acid. By way of example and not limitation, the crosslinking reaction associated with the polymer inside the ARC composition is performed at or below about 200 degrees Celsius, and the crosslinking reaction associated with the polymer between the ARC composition and a protective layer 196 which will be formed thereafter shown in FIG. 22 is triggered at or above about 250 degrees Celsius.

In some embodiments, the crosslinking reaction associated with the polymer inside the ARC composition is performed at a temperature in a range from about 150 to about 200 degrees Celsius. If the temperature is lower than about 150 degrees Celsius, the crosslinking reaction associated with the polymer inside the ARC composition may not be triggered by the first thermal acid generator. If the temperature is greater than about 200 degrees Celsius, an acid for crosslinking reaction associated with the polymer in the sacrificial layer 192 and the protective layer 196 which will be formed thereafter shown in FIG. 22 may generate by the second thermal acid generator, and thus in the process of selective growth of the protective layer 196 to the sacrificial layer 192, sufficient acid cannot be generated in the sacrificial layer 192 so that the protective layer 196 may not selectively grow on the sacrificial layer 192 to acts as an etch mask to protect the work function metal layer 186 below the sacrificial layer 192 from the etching process, then in turn adversely affects the performance of the semiconductor device. In some embodiments, the crosslinking reaction associated with the polymer inside the ARC composition is performed at a temperature in a range from about 100 to about 250 degrees Celsius. In some embodiments, the crosslinking reaction associated with the polymer inside the ARC composition is performed at a temperature in a range from about 150 to about 250 degrees Celsius. In some embodiments, the crosslinking reaction associated with the polymer inside the ARC composition is performed at a temperature in a range from about 200 to about 280 degrees Celsius.

The following discussion is directed to more detailed descriptions of some components of the ARC composition and some exemplary processes of making the same.

In some embodiments, the polymer is suitable for use in deep UV (DUV) imaging systems. The polymer includes a chromophore for effectively absorbing reflections in the DUV range, such as from about 100 nm to about 300 nm. In some embodiments, the chromophore is an aromatic group such as a polycyclic hydrocarbon or heterocyclic unit and may include substituted and unsubstituted phenanthryl, substituted and unsubstituted anthracyl, substituted and unsubstituted acridine, substituted and unsubstituted naphthyl, substituted and unsubstituted quinolinyl, ring-substituted quinolinyls, and substituted and unsubstituted anthracyl groups. In some embodiments, the polymer including the chromophore is suitable for use in another imaging system, such as a system using UV radiation, extreme UV (SUV) radiation, electron beam, ion beam, x-ray, or other suitable radiation.

In some embodiments of the present disclosure, the polymer includes recurring monomers represented by the following formula:

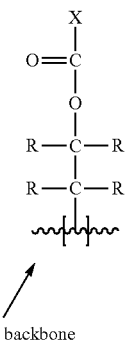

polymer backbone wherein R is individually selected from the group consisting of —OH, —H, and substituted and unsubstituted alkyl groups. In some embodiments, X includes one of the chromophore discussed above. In some embodiments, X includes an aromatic and/or heterocyclic light-absorbing moiety such as those selected from the group consisting of thiophenes, naphthoic acid, anthracene, naphthalene, benzene, chalcone, phthalimides, pamoic acid, acridine, azo compounds, dibenzofuran, and derivatives thereof. In yet another embodiment, X includes a crosslinker.

In some embodiments of the present disclosure, the polymer of the ARC composition is represented by the following formula:

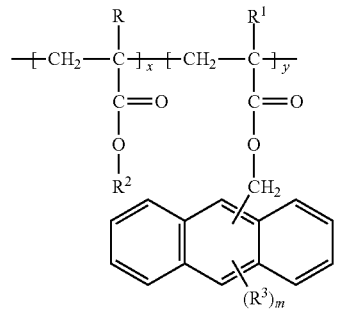

wherein R and $R^1$ is independently a hydrogen or a substituted or unsubstituted alkyl group. $R^2$ is a substituted or unsubstituted alkyl group, $R^3$ is a halogen, an alkyl, an alkoxy, an alkenyl, an alkynyl, or a combination thereof.

In various embodiments of the present disclosure, the crosslinker may be part of the polymer functional groups or may be an independent crosslinker. In some embodiments, the crosslinker is a polyether polyol, a polyglycidyl ether, or a combination thereof. In an example, the polyether polyol is a compound represented by the following formula:

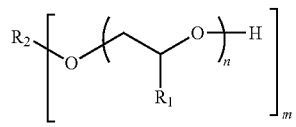

wherein R1 represents a hydrogen atom or an alkyl group; and R2 represents an alkyl group, an alkenyl group, an alkynyl group, an alkylcarbonyl group, an alkyloxyalkyl group, an alkylamino group, an alkyldiamino group, or a combination thereof.

In an example, the polyglycidyl ether is a compound represented by the following formula:

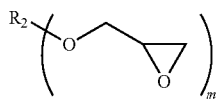

wherein the R2 may be an alkyl group with hydrogen attached of hydrocarbon with straight, branched, or cyclic structure. The alkyl group may also contain hetero atoms. By way of example and not limitation, it may contain nitrogen or oxygen.

The glycidyl ether can be replaced by alkyl oxide, alkene, alkyne, triazene or other crosslinkable functional groups such as those represented by one of the following formulae:

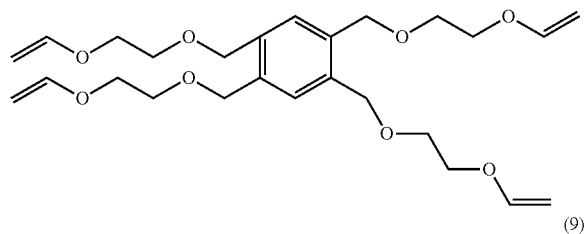

(9)

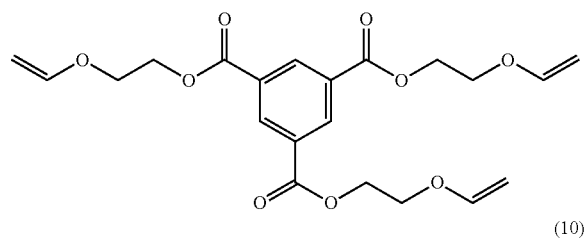

(10)

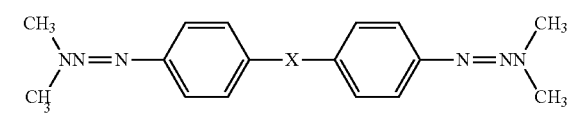

In another example, the crosslinker is a methoxy methylated glycouril represented by the following formula:

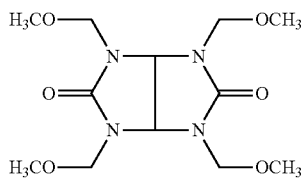

In some embodiments, the first or second thermal acid generator may have the following formulas: RCOO—CH$_2$CF$_2$SO$_3^-$H$^+$, and RCOO—CH$_2$CF$_2$SO$_3^-$(R$_1$)$_4$N$^+$. The R represents a substituted or unsubstituted linear, branched, or cyclic alkyl group having 1 to 20 carbon atoms, or a substituted or unsubstituted aryl group having 6 to 14 carbon atoms, and R1 represents a hydrogen atom, a substituted or unsubstituted linear, branched, or cyclic alkyl group, alkenyl group, ozoalkyl group having 1 to 10 carbon atoms, aryl group, aralkyl group, aryloxoalkyl group having 6 to 18 carbon atoms.

Other forms of floating acid may be used. By way of example and not limitation, various organic acids and free acids may be used in accordance with principles described herein. Particularly, acids that tend to float up and cause diffusion into smaller regions affected by a scattering bar during exposure by a mask.

In some embodiments, the ARC composition may include other optional ingredients, such as surfactants and adhesion promoters.

In some embodiments, the ARC composition can be synthesized by an ordinary method, such as radical polymerization. By way of example and not limitation, a batch polymerization method can be used. To further this example, various monomer species and a radical initiator are dissolved in a solvent for a sufficient amount of time, either heated or in ambient temperature, to form a substantially homogeneous dispersion. Alternative method can be used. By way of example and not limitation, a dropping polymerization method can be used in forming the ARC composition where a solution containing various monomer species and a radical initiator is added dropwise to a heated solvent. In some embodiments, the solvent is selected from the group consisting of propylene glycol methyl ether acetate (PGMEA), propylene glycol methyl ether (PGME), propylene glycol n-propyl ether (PnP), ethyl lactate (EL), and mixtures thereof.

Figure 19:
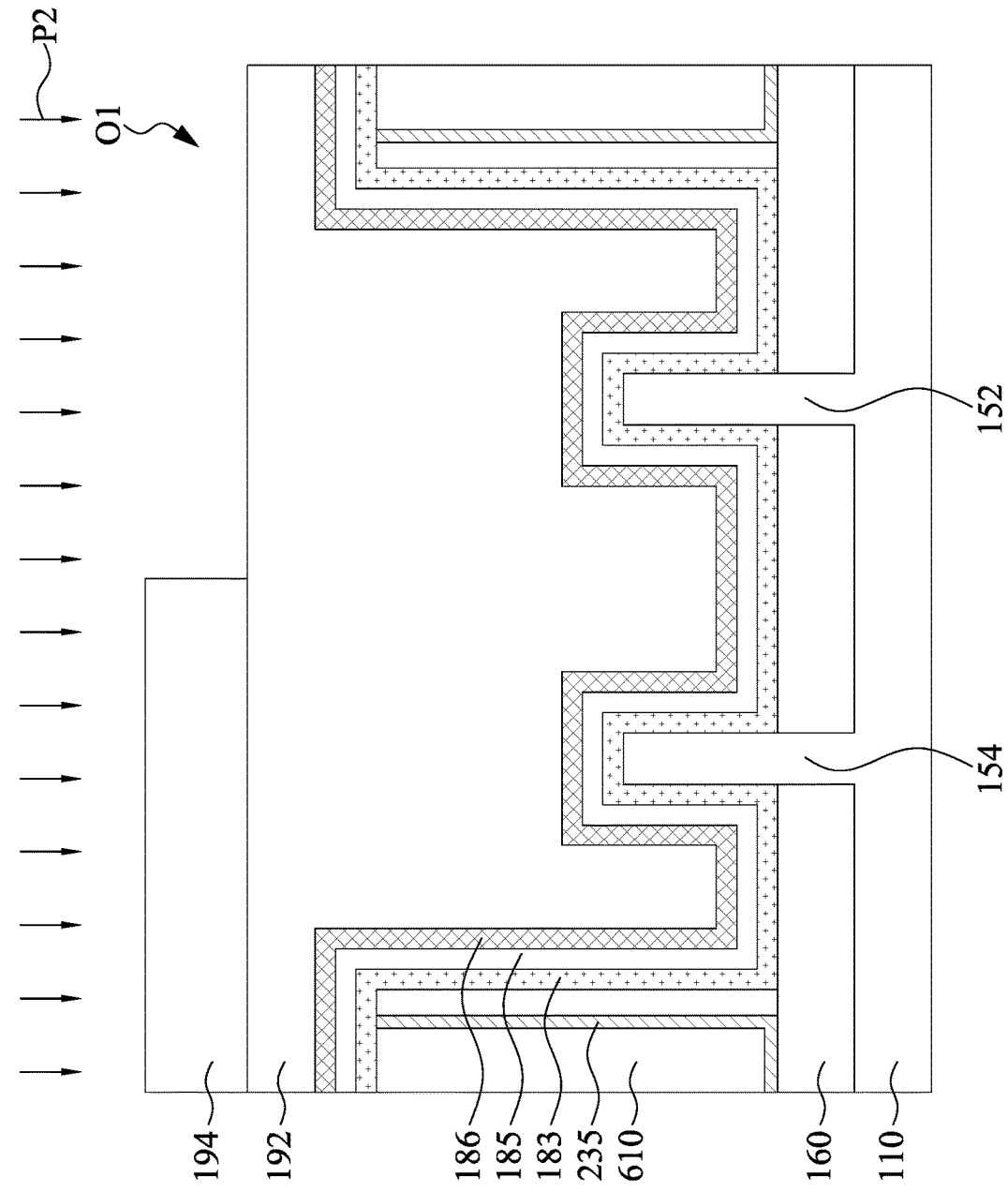

Referring to FIG. 1B, the method M then proceeds to block S27 where a patterned mask layer is formed over the sacrificial layer. With reference to FIG. 19, in some embodiments of block S26, after forming the sacrificial layer 192, a patterned mask layer 194 is formed over the sacrificial layer 192. In some embodiments, the mask layer 194 is formed by spin coating a resist material (e.g., the mask layer 194 may be also referred to as a photo resist layer), followed by a process P2, such as a soft baking process and a hard baking process (may be also referred to as a pre-exposure baking). In some embodiments, the soft baking process and/or the hard baking process is performed at a temperature that is lower than what is needed to trigger the generation of the second acid shown in FIG. 23. By way of example and not limitation, the soft baking process and/or the hard baking process is performed at or below about 120 degrees Celsius. In some embodiments, the soft baking process and/or the hard baking process is performed at or below about 150 degrees Celsius. In some embodiments, the soft baking process and/or the hard baking process is performed at or below about 100 degrees Celsius.

In some embodiments, the mask layer 194 is a DUV resist such as a krypton fluoride (KrF) resist or an argon fluoride (ArF) resist. In some embodiments, the mask layer 194 is an I-line resist, a EUV resist, an electron beam (e-beam) resist, or an ion beam resist. In some embodiments, the mask layer 194 is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer 194 is a negative resist. The negative resist is soluble in a developer but becomes insoluble upon radiation.

After coating the mask layer 194 on the sacrificial layer 192, the mask layer 194 is exposed to a radiation through a mask. In some embodiments, the radiation is a DUV radiation such as KrF excimer laser (248 nm) or ArF excimer laser (193 nm). Alternatively, the radiation may be an I-line (365 nm), a EUV radiation (e.g., 13.8 nm), an e-beam, an x-ray, an ion beam, or other suitable radiations. The radiation causes the PAGs in the mask layer 194 to produce an acid. The exposure may be performed in air, in a liquid (immersion lithography), or in a vacuum (e.g., for EUV lithography and e-beam lithography). In some embodiments, the radiation is patterned with the mask, such as a transmissive mask or a reflective mask, which may include resolution enhancement techniques such as phase-shifting and/or optical proximity correction (OPC). In some embodiments, the radiation is directly modulated with a predefined pattern, such as an IC layout, without using a mask (maskless lithography). Regardless of the radiation and the optional mask being used, the chromophore in the sacrificial layer 192 is tuned to absorb the radiation that passes through the resist layer 194, thereby reducing reflections of the radiation off of the complicated topography on the substrate 110. This improves the resist pattern's uniformity.

After exposing the mask layer 194 to the radiation, the exposed mask layer 194 undergoes one or more post-exposure baking (PEB) processes that may include in the process P2. In some embodiments, the PEB process is performed at a temperature that is lower than what is needed to trigger the generation of the second acid shown in FIG. 23. By way of example and not limitation, the PEB process is performed at or below about 120 degrees Celsius. In some embodiments, the PEB process is performed at or below about 150 degrees Celsius. In some embodiments, the PEB process is performed at or below about 100 degrees Celsius. The PEB processes accelerate the cleaving of the ALGs in the mask layer 194. This cleaving reaction is catalytic, in the sense that the acid still remains after the reaction, and is therefore available to promote the cleaving of additional ALGs. Such a cleaving reaction will be terminated only when the acid produced comes in contact with a base, also referred to as a base quencher. When the ALGs leave the backbone polymer of the mask layer 194, the branch unit of the polymer will be changed to carboxylic group that increases the polymer's solubility to a positive tone developer and allows the irradiated area of the mask layer 194 to be removed by a developer. The non-irradiated area remains insoluble and becomes a masking element for subsequent processes.

After undergoing a developing process in a developer, portions of the exposed mask layer 194 are removed, resulting in a patterned mask layer 194 as shown in FIG. 19. The patterned mask layer 194 has an opening O1. In some embodiments, a developer includes a water based developer, such as tetramethylammonium hydroxide (TMAH) for a positive tone development (PTD). In other embodiments, a developer may include an organic solvent or a mixture of organic solvents, such as methyl a-amyl ketone (MAK) or a mixture involving the MAK, for a negative tone development (NTD). Applying a developer includes spraying the developer on the exposed mask layer 194, by way of example and not limitation, by a spin-on process. The developing process may further include a post develop baking (PDB) process. In some embodiments, the developing process does not substantially dissolve or remove the sacrificial layer 192. Rather, it exposes the sacrificial layer 192 through the opening O1.

Figure 20:
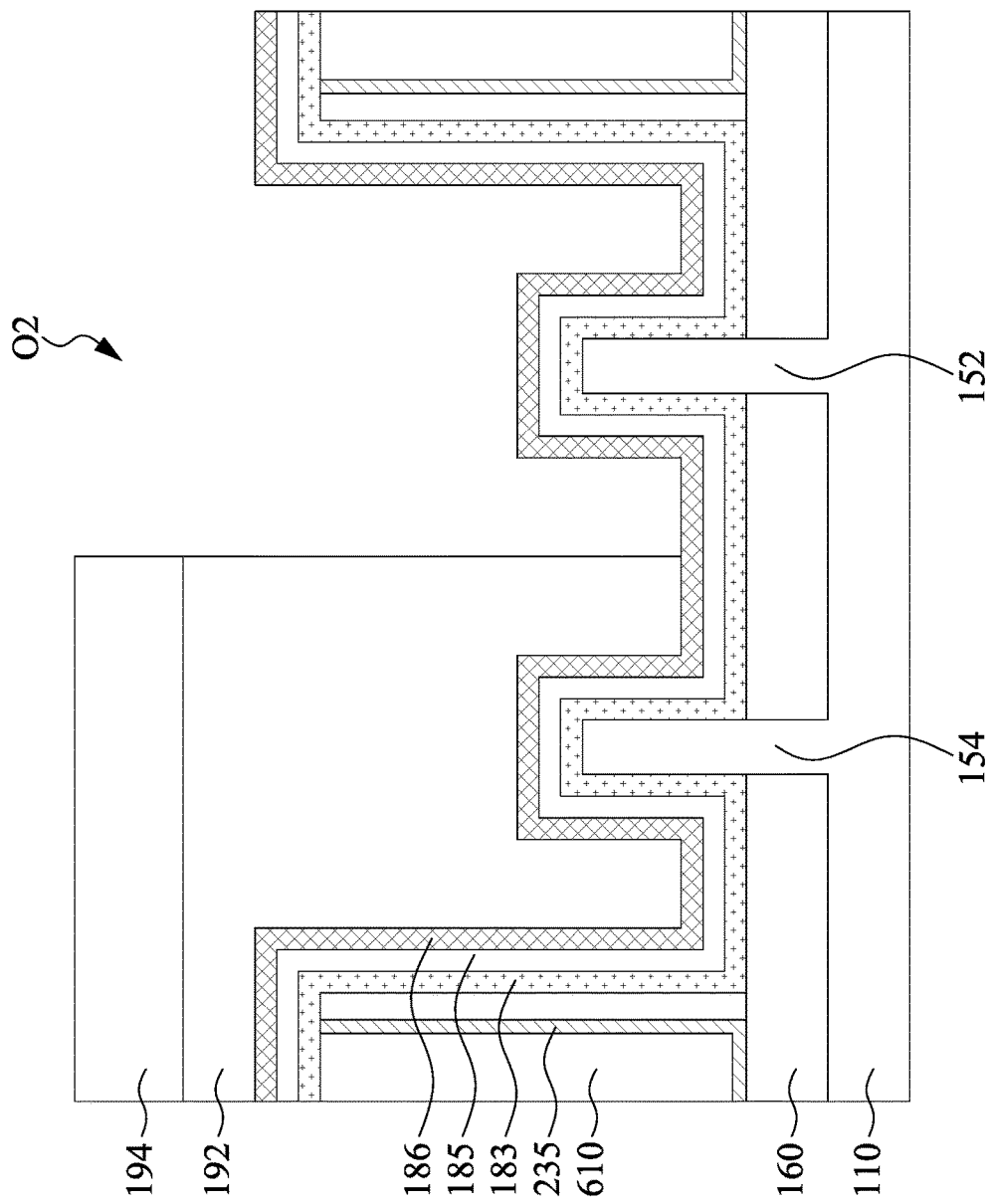

Referring to FIG. 1B, the method M then proceeds to block S28 where the sacrificial layer is patterned through the patterned mask layer. With reference to FIG. 20, in some embodiments of block S28, the sacrificial layer 192 is etched through the opening O2. Referring to FIG. 20, the patterned mask layer 194 acts as an etch mask to protect the rest of the sacrificial layer 192 from the etching process. In some embodiments, the etching process is a dry etching process. By way of example and not limitation, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 21:
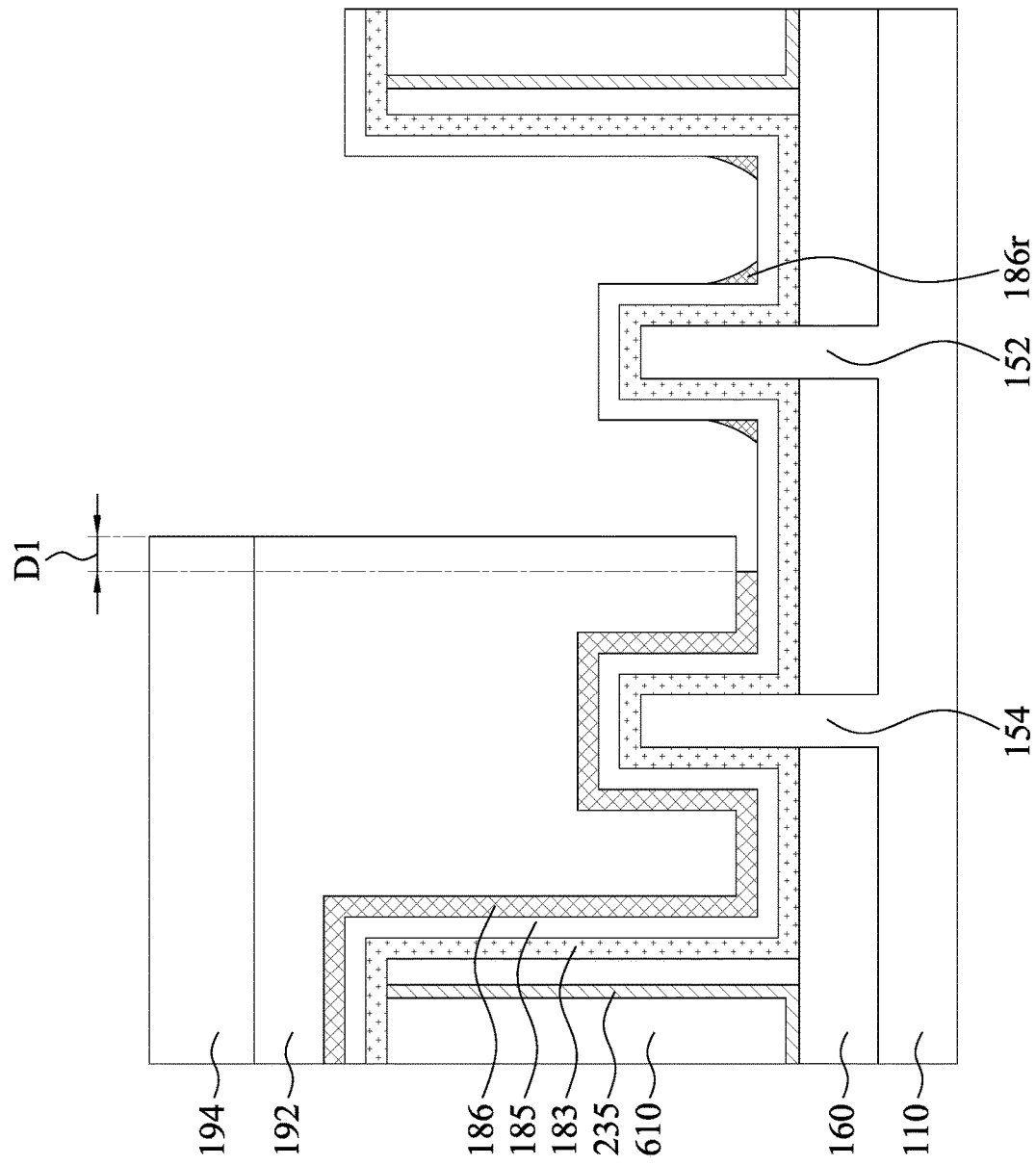

Referring to FIG. 1B, the method M then proceeds to block S29 where the first work function metal layer that is not covered by the patterned sacrificial layer is partially removed. With reference to FIG. 21, in some embodiments of block S29, the removing of the work function metal layer 186 that is not covered by the patterned sacrificial layer 192 may include a wet etch process, or other suitable etching processes, may be used to pattern the work function metal layer 186. In some embodiments, the etch process include using a technique and etchant selected to selectively etch the work function metal layer 186 without significant etching of the surrounding structures. By way of example and not limitation, in embodiments where the first work function metal layer 186 is formed of TiN, a wet etching process using $NH_4OH+H_2O_2+H_2O$ (APM), and/or the like, may be used. Other processes and materials may be used.

In FIG. 21, the etching removes a portion of the work function metal layer 186 that direct below the patterned sacrificial layer 192. In particular, the etching may be configured to stop while an end surface of the work function metal layer 186 is coplanar with a sidewall of the patterned sacrificial layer 192. By way of example and not limitation, the etching may be configured to minimize a distance D1 (may be also referred to as a lateral etch length) between the end surface of the work function metal layer 186 and the sidewall of the patterned sacrificial layer 192. Therefore, the aforementioned etching may cause the work function metal layer 186 remains on the semiconductor fin 154 as residues 186r that is not covered by the patterned sacrificial layer 192, in which the residues 186r will be removed by a sequent process.

Referring to FIG. 1C, the method M then proceeds to block S30 where a protective layer is formed over the substrate. With reference to FIG. 22, in some embodiments of block S30, the protective layer 196 is coated on the substrate 110. The protective layer 196 may be applied to the photosensitive layer 116 using any suitable technique, and in some embodiments, the protective layer 196 is applied via a spin-on coating and curing process.

In some embodiments, the protective layer 196 may include one or more of; a grafting monomer, an acid-switchable monomer, and/or an organic-soluble monomer each bonded to a chemical backbone. The grafting monomer can be a basicity monomer with a logarithmic acid dissociation constant (pKa) larger than 7. In some embodiments, the grafting monomer may include ammonia, primary amine, secondary amine, tertiary amine, amide, hydroxide, NCS—(N-chlorosuccinimide), alkenyl, phenol, or cyanide. However, it is understood that other basicity monomers may be used. The grafting monomer reacts with acid to bond the protective layer 196 to the photoresist material.

The acid-switchable monomer may include an acid-labile group, e.g. a protective group, and is catalyzed by acid. As a protective group, the acid-switchable monomer prevents the grafting monomer from reacting with acid and photoresist material. When baked at a high temperature, by way of example and not limitation, above 80 degrees Celsius, the acid-switchable monomer de-protects. When the acid-switchable monomer de-protects, it becomes a reactive site for grafting monomer. In some embodiments, the acid-switchable monomer may include an acid-cleavable cyclic and branched aliphatic carbonyl, ester, oligomeric ester, ether, carbonate, or orthoester. In some preferred embodiments, the acid-switchable monomer may include methyl cyclopentane, ethyl cyclopentane, or methyl adamantane.

In some embodiments, the protective layer 196 may additionally include an organic-soluble monomer. The organic-soluble monomer is an organic compound such as an aliphatic compound, which enhances solubility of protective layer 196 in an organic solvent or a development solvent. In preferred embodiments it may include a C5-C20 alkyl group, a cycloalkyl group, a C5-C20 saturated or unsaturated hydrocarbon ring, or a C5-C20 heterocyclic group.

In some embodiments, the protective layer 196 may additionally include a thermal acid generator different than that in the sacrificial layer 192 and the thermal acid generator may have the following formulas: RCOO—$CH_2CF_2SO_3^-H^+$, and RCOO—$CH_2CF_2SO_3^-(R_1)_4N^+$. The R represents a substituted or unsubstituted linear, branched, or cyclic alkyl group having 1 to 20 carbon atoms, or a substituted or unsubstituted aryl group having 6 to 14 carbon atoms, and R1 represents a hydrogen atom, a substituted or unsubstituted linear, branched, or cyclic alkyl group, alkenyl group, ozoalkyl group having 1 to 10 carbon atoms, aryl group, aralkyl group, aryloxoalkyl group having 6 to 18 carbon atoms.

Figure 23:
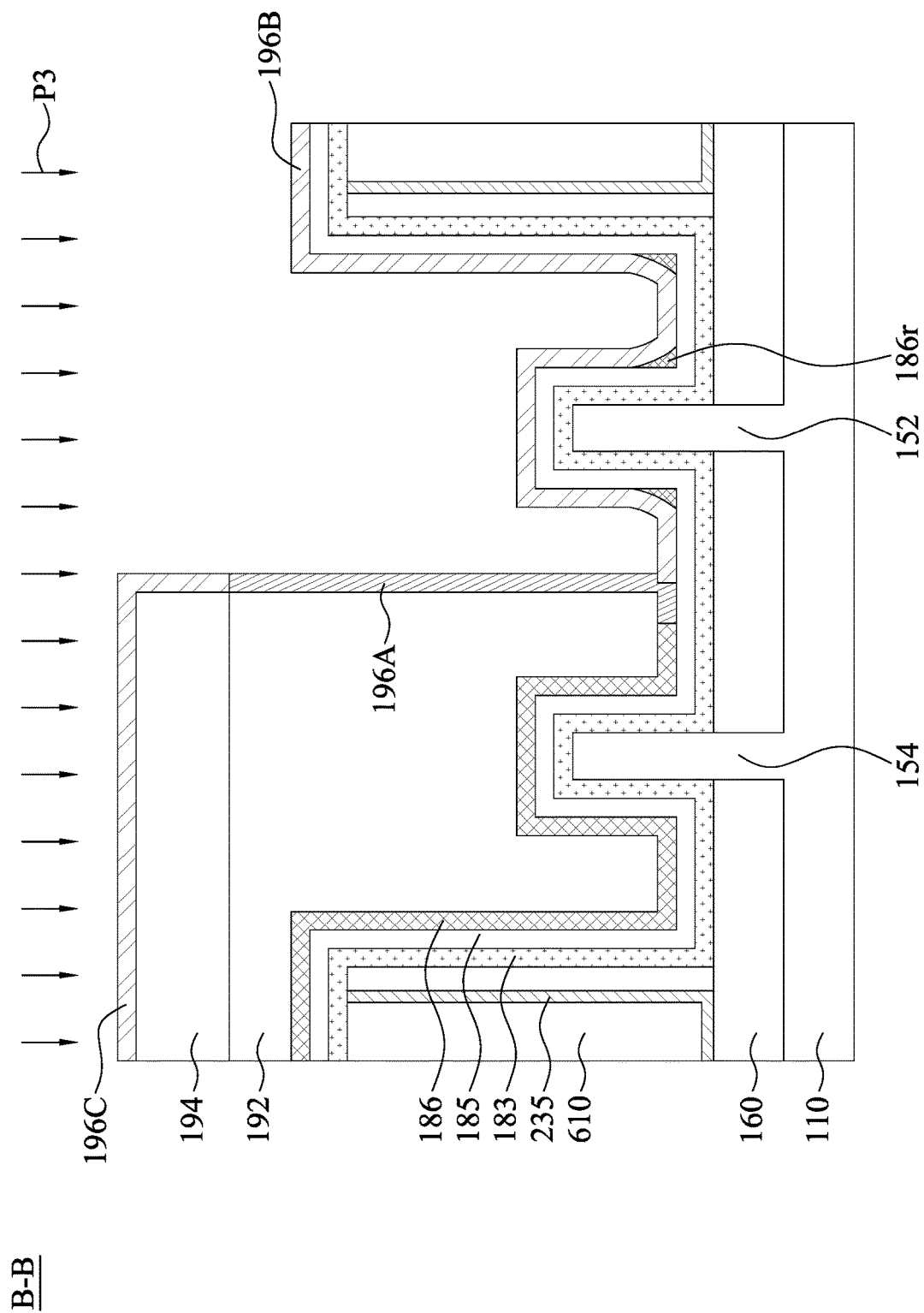

Referring to FIG. 1C, the method M then proceeds to block S31 where a baking process is performed on the substrate to crosslink the sacrificial layer with the protective layer. With reference to FIG. 23, in some embodiments of block S31, a baking process P3 is performed. The baking process P3 may be performed at a temperature higher enough to thermally generate an acid of the second thermal acid generator in the sacrificial layer 192. By way of example and not limitation, the sacrificial layer 192 is baked at or above about 250 degrees Celsius. In some embodiments, the baking process P3 is performed at the temperature higher than the baking process P1 shown in FIG. 18. The baking process P3 causes the second thermal acid generator of the sacrificial layer 192 to generate acid, the generated acid may diffuse to a surface of the sacrificial layer 192, and also creates new reaction sites in the protective layer 196 to allow bonding with or crosslinking to the acid of the sacrificial layer 192. This occurs because the baking process P3 causes the acid-switchable monomer of the protective layer 196 to de-protect and become a reactive monomer which is catalyzed by the acid, facilitating reaction with other bonding materials, such as the protective layer 196.

In FIG. 23, portions 196B and 196C of the protective layer 196 do not bond with or crosslink to the protective layer 196, and a portion of the protective layer 196 bonding with the sacrificial layer 192 may be referred to a selective growth layer 196A. In some embodiments, a portion of the selective growth layer 196A interposed between the sacrificial layer 192 and the dielectric cap 185 may act as a seal protection. Therefore, the selective growth layer 196A may acts as an etch mask to protect the work function metal layer 186 below the sacrificial layer 192 from the etching process for the residues 186r of the work function metal layer 186. By contrast, if there is no selective growth layer 196A formed between the sacrificial layer 192 and the dielectric cap 185, the work function metal layer 186 under the sacrificial layer 192 may be etched during the etching process for work function metal layer 186 and cannot reach a present amount for the transistor 14, then in turn adversely affects the performance of the semiconductor device.

In some embodiments, the sacrificial layer 192 is baked at a temperature in a range from about 250 to about 350 degrees Celsius. If the temperature is lower than about 250 degrees Celsius, the crosslinking reaction associated with the polymer in the sacrificial layer 192 and the protective layer 196 may not be triggered by the second thermal acid generator. If the temperature is lower than about 350 degrees Celsius, then in turn adversely affects the performance of the semiconductor device. In some embodiments, the sacrificial layer 192 is baked at a temperature in a range from about 180 to about 380 degrees Celsius. In some embodiments, the sacrificial layer 192 is baked at a temperature in a range from about 200 to about 400 degrees Celsius. In some embodiments, the sacrificial layer 192 is baked at a temperature in a range from about 280 to about 320 degrees Celsius.

Figure 24:
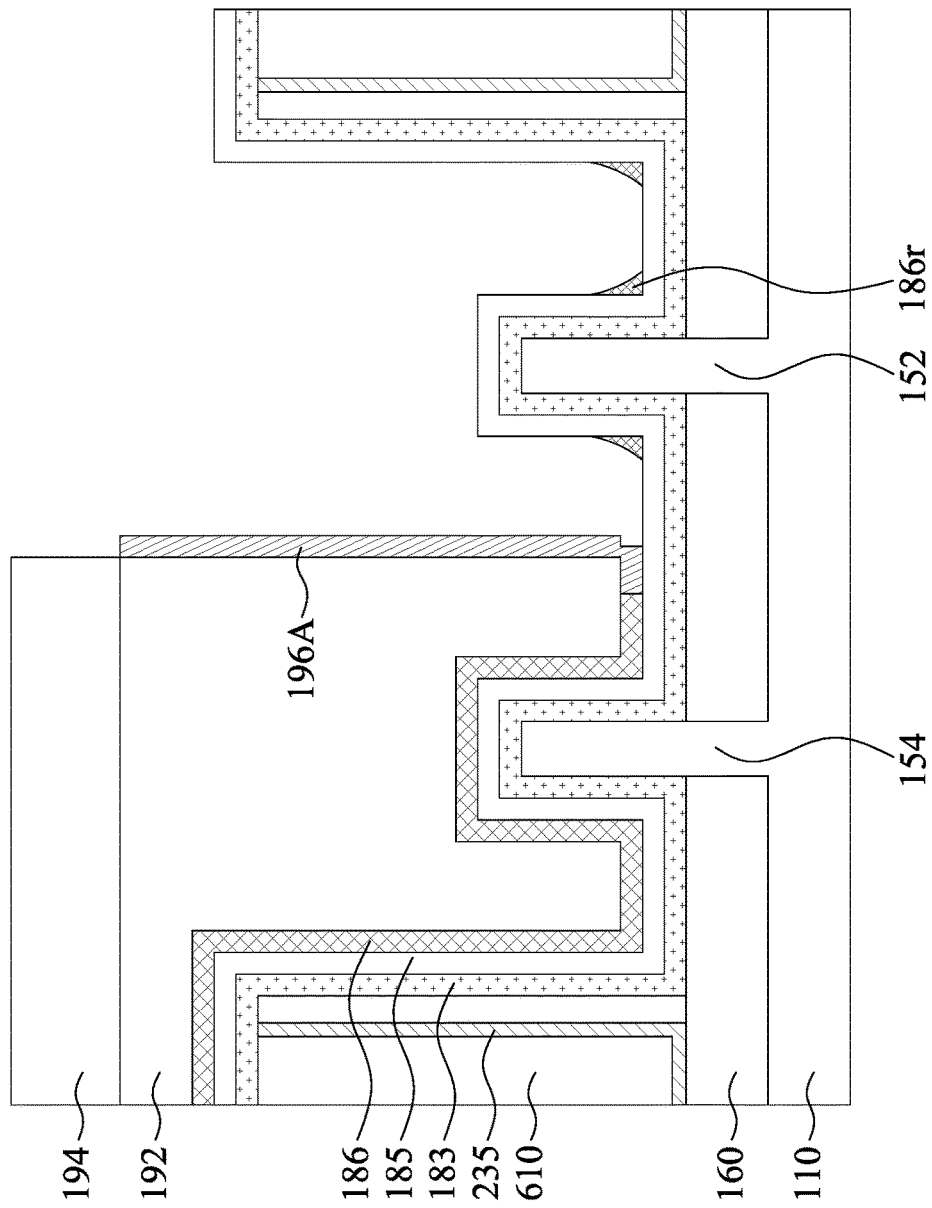

Referring to FIG. 1C, the method M then proceeds to block S32 where a portion of the protective layer that not crosslink with the sacrificial layer are removed. With reference to FIG. 24, in some embodiments of block S32, a wet etch process, or other suitable etching processes, may be used to remove the portions 196B and 196C of the protective layer 196 that not bond with the protective layer 196.

In some embodiments, if more thickness of the protective layer 196 is desired, then the above process shown in FIGS. 22-24 may be repeated. In this case, the protective layer 196 shown in FIG. 24 is coated with another bonding material similar to the protective layer 196 in terms of composition and formation, may include a grafting monomer, an acid-switchable monomer, and/or an organic-soluble monomer. However, the grafting monomer and acid-switchable monomer may be different from those used in the protective layer 196. Alternatively, the bonding material may include the same chemicals as the protective layer 196. The sacrificial layer 192 may be mixed in a solution with a third thermal acid generator different than the first and second thermal acid generators.

Then, a baking process is performed on the coated bonding material and the sacrificial layer 192 that includes the third thermal acid generator. The baking process may be performed at a temperature higher enough to thermally generate an acid of the third thermal acid generator in the sacrificial layer 192. In some embodiments, the baking process for the bonding material is performed at a temperature higher than the baking process P1 shown in FIG. 18 and the baking process P3 shown in FIG. 23. In some embodiments, the treatments mentioned above may perform more cycles of coating with bonding material mixed with various thermal acid generator in the sacrificial layer 192 until a desired thickness of protective layer for the work function layer is achieved.

Figure 25:
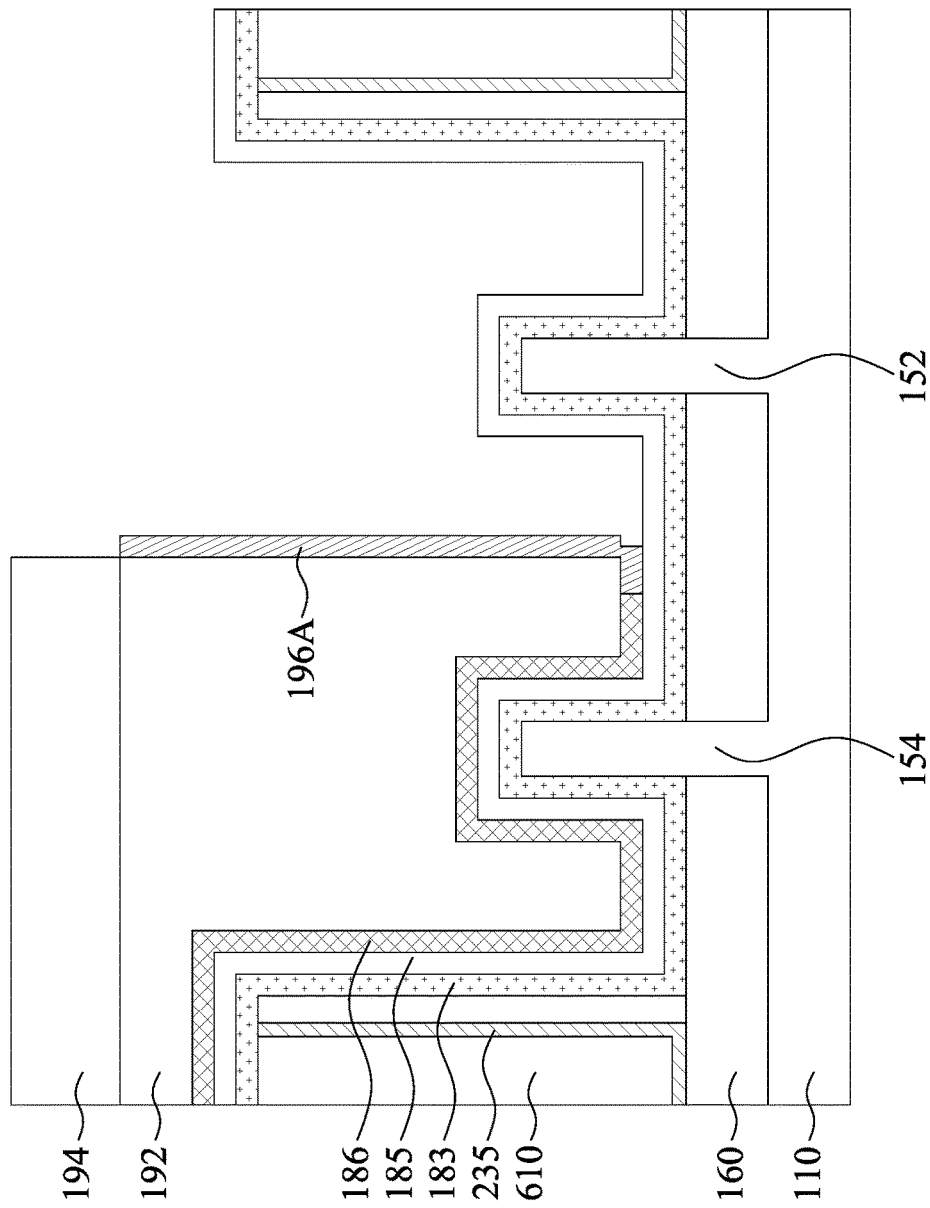

Referring to FIG. 1C, the method M then proceeds to block S33 where a portion of the first work function metal layer not covered by the sacrificial layer and the protective layer is moved. With reference to FIG. 25, in some embodiments of block S33, a wet etch process, or other suitable etching processes, may be used to remove first work function metal layer 186 not covered by the sacrificial layer 192 and the selective growth layer 196A. The selective growth layer 196A protects the work function metal layer 186 below the sacrificial layer 192 from the etching process for the residues 186r of the work function metal layer 186. By way of example and not limitation, in embodiments in which the first work function metal layer 1110 is formed of TiN, a wet etching process using NH₄OH+H₂O₂+H₂O (APM), and/or the like, may be used. Other processes and materials may be used.

Figure 26:
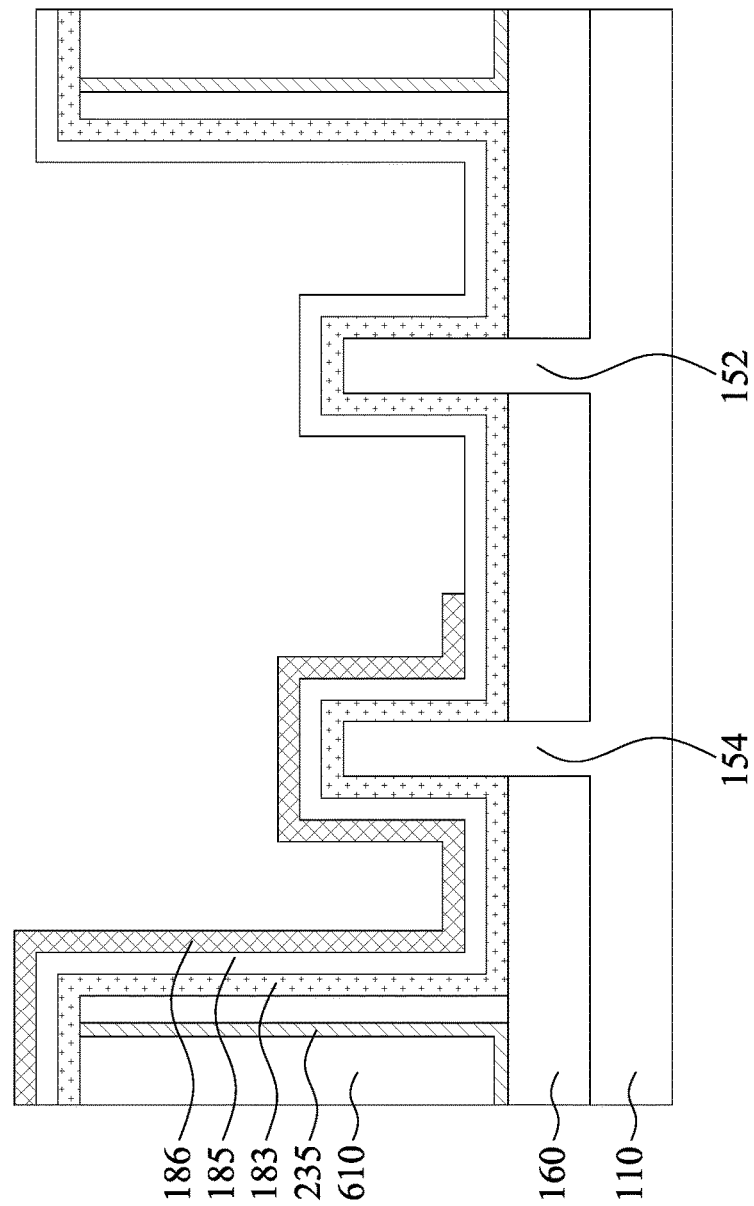

Referring to FIG. 1C, the method M then proceeds to block S34 where the sacrificial layer, the patterned mask layer, and the protective layer are removed. With reference to FIG. 26, in some embodiments of block S34, the sacrificial layer 192, the patterned mask layer 194, and the selective growth layer 196A may be removed using an ashing process in an ambient of $N_2$, $H_2$, $O_2$ and a temperature of about 150° C. to about 350° C.

Figure 27:
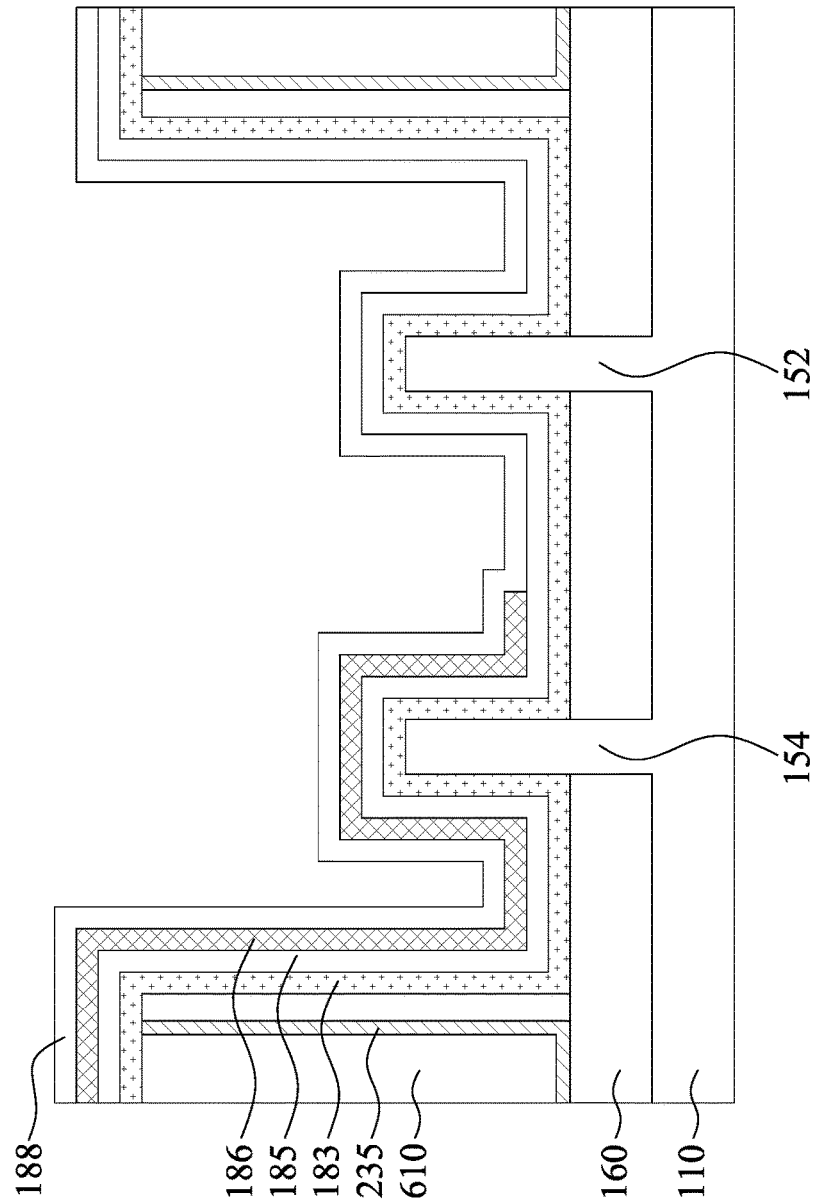

Referring to FIG. 1C, the method M then proceeds to block S35 where a second work function metal layer is formed over the substrate. With reference to FIG. 27, in some embodiments of block S35, a work function metal layer 188 is conformally formed on the work function metal layer 186 in an area of the semiconductor fin 154 and over an area of the semiconductor fin 152. The work function layer 188 can provide another suitable work function value for the gate stack of the semiconductor device. In some embodiments, the work function layer 188 may include a tantalum-containing material, such as, by way of example and not limitation, tantalum nitride (TaN). In some embodiments, tantalum is absent in the work function layer 188. The work function layer 188 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Figure 28:
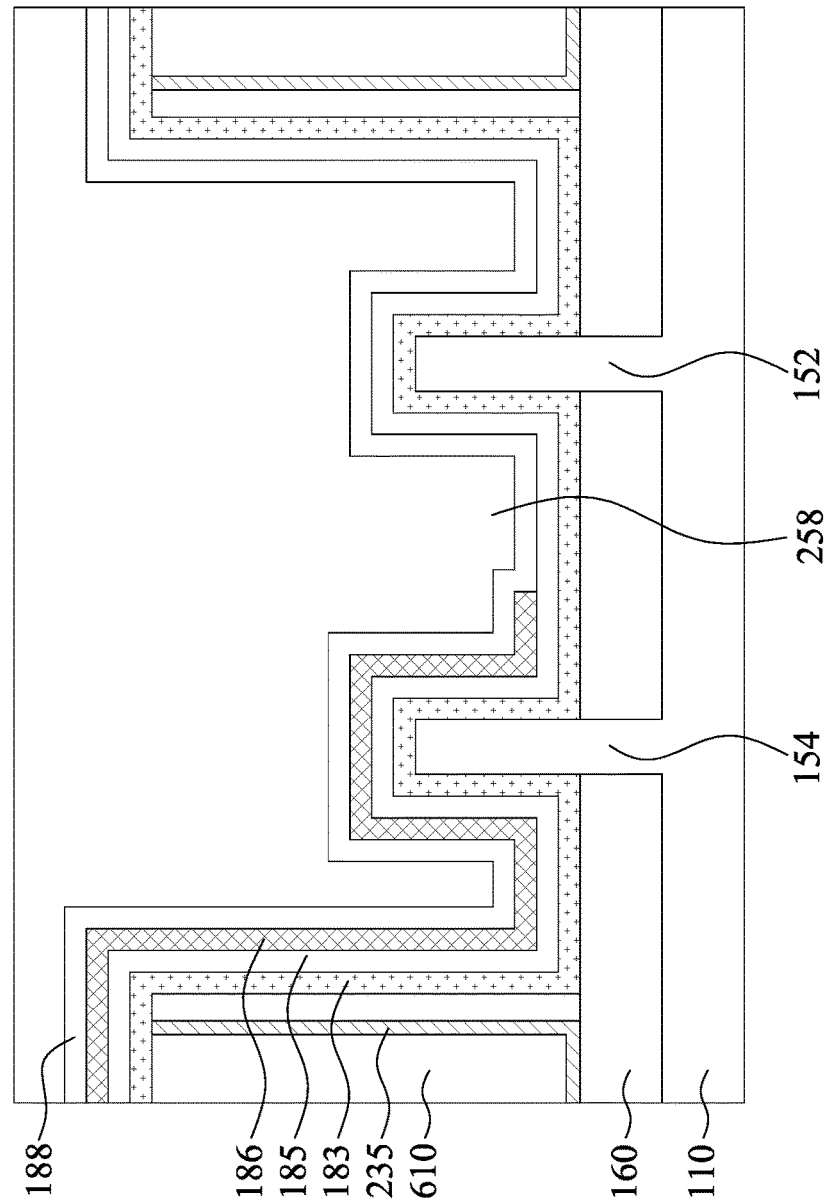

Referring to FIG. 1C, the method M then proceeds to block S36 where a remaining gate trench is filled with filling conductor. With reference to FIG. 28, in some embodiments of block S36, a remaining gate trench GT is then filled or overfilled with a filling conductor 258. In some embodiments, the filling conductor 258 includes, by way of example and not limitation, tungsten (W). The filling conductor 258 can be formed using ALD, PVD, CVD, or other suitable process. In some other embodiments, the filling conductor 258 may be a metal selected from a group of W, Cu, Ti, Ag, Al, TiAl, TiAlN, TaC, TaCN, TaSiN, Mn, Co, Pd, Ni, Re, Ir, Ru, Pt, and Zr, or other suitable material. In some other embodiments, the filling conductor 258 may be a metal alloy, such as Ti—Al, Ru—Ta, Ru—Zr, Pt—Ti, Co—Ni and Ni—Ta, or other suitable conductive material and/or a metal nitride, such as WNx, TiNx, MoNx, TaNx, and TaSixNy, or other suitable conductive material. In some embodiments, an additional material may be formed on the work function metal layer 188, and the filling conductor 258 may be formed on the additional material. Such an additional material may be, by way of example and not limitation, TiN, which may increase the adhering strength of tungsten and TiAlC.

Figure 29:
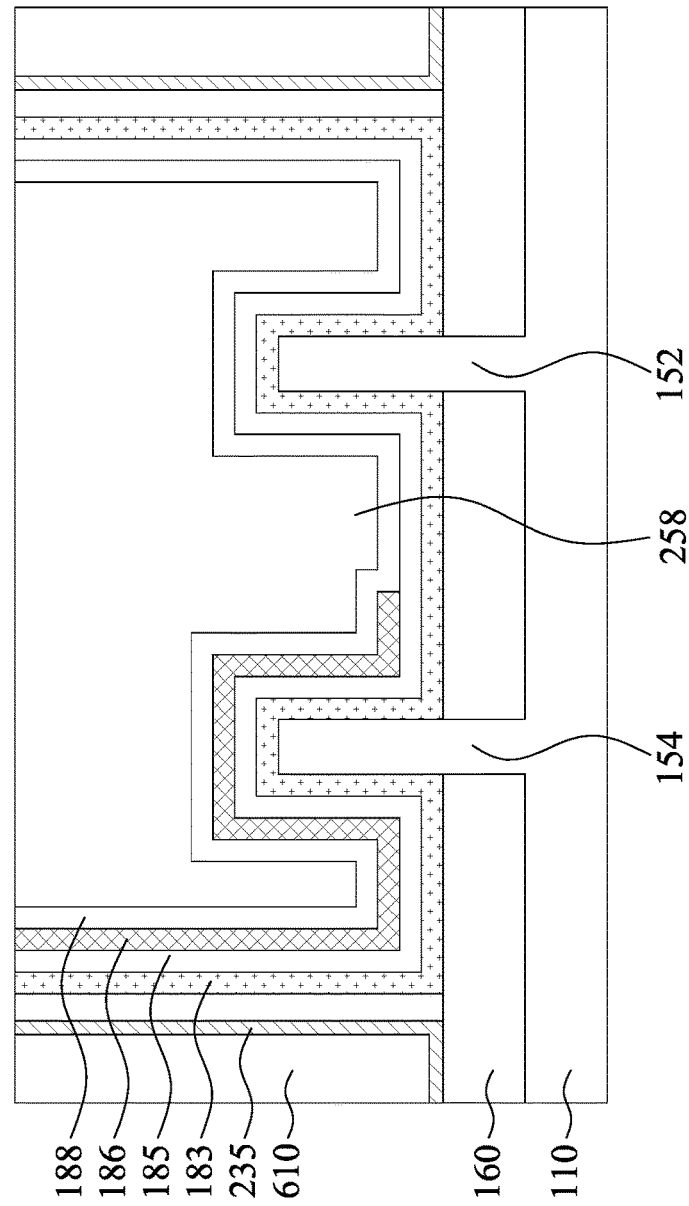

Referring to FIG. 1C, the method M then proceeds to block S37 where the filling conductor, the first and second work function metal layers, the dielectric cap, and the gate dielectric layer are planarized until the first interlayer dielectric layer is exposed to form gate structure. With reference to FIG. 29, in some embodiments of block S37 a planarization process, such as a chemical mechanical planarization (CMP) process is applied to remove excessive the filling conductor 258, the first and second work function metal layers 186 and 188, the dielectric cap 185, and the gate dielectric layer 183 outside the gate trench GT to provide a substantially planar top surface. The remaining work function metal layers 186 and 188 and the remaining filling conductor 258 form a gate stack in the gate trench GT. The gate stack may be referred to as metal gate electrodes in some cases. It is understood that the formation of the gate stack mentioned above is illustrative, and is not limiting the present disclosure. In some embodiments, a portion of the gate stack above the semiconductor fin 154 may be referred to as NMOS metal gate electrode and another portion of the gate stack above the semiconductor fin 152 may be referred to as PMOS metal gate electrode.

Figure 30:
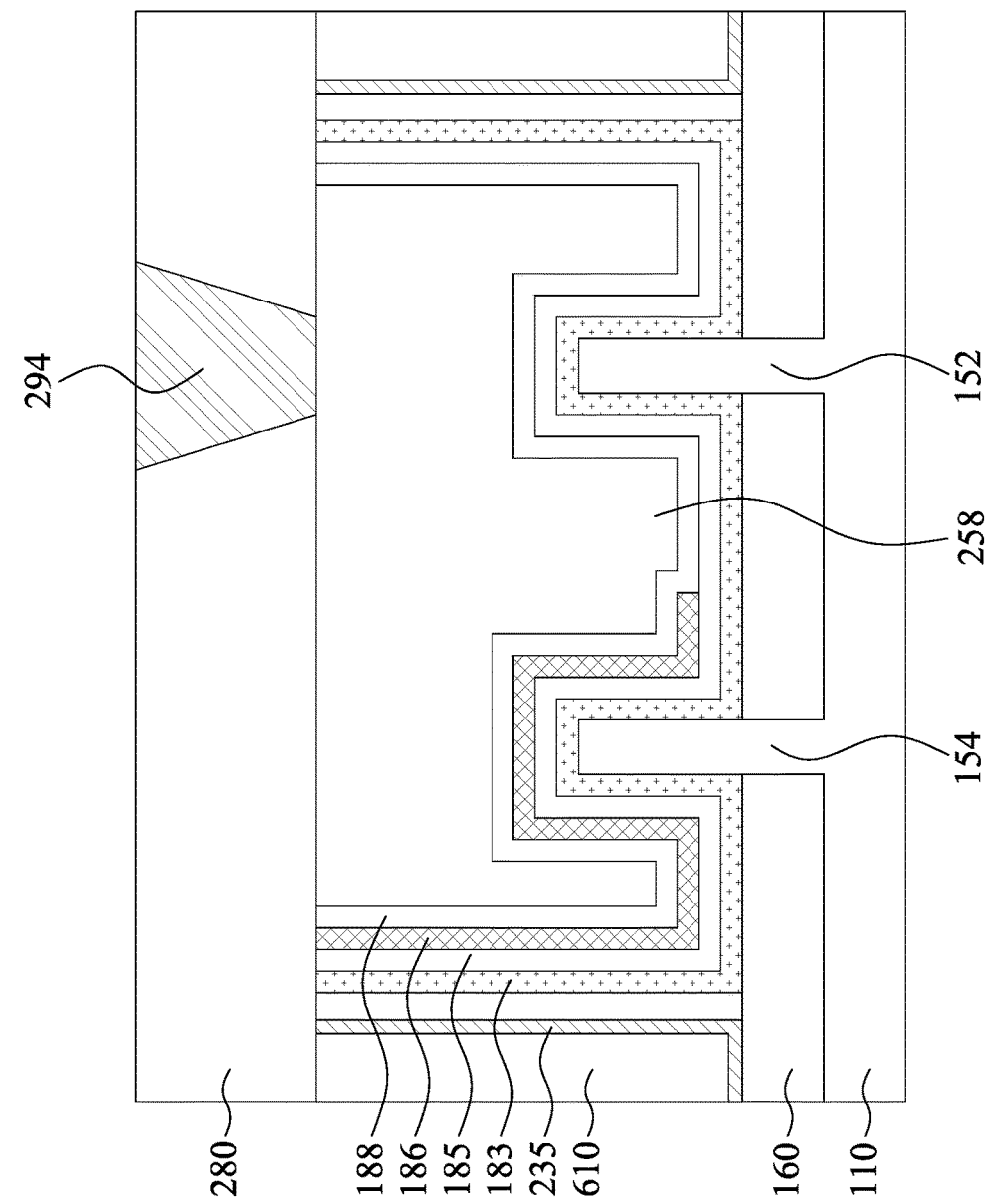

Referring to FIG. 1C, the method M then proceeds to block S38 where a gate contact is formed to land on the gate structure. With reference to FIG. 30, in some embodiments of block S38, an interlayer dielectric (ILD) layer 280 is formed over the gate stack and the ILD layer 610. The ILD layer 280 is made of silicon oxide, silicon nitride, silicon oxynitride, fluoride-doped silicate glass (FSG), or other low-K dielectric materials. In some embodiments, the ILD layer 280 may be formed using a high-density-plasma (HDP) chemical vapor deposition (CVD) process, using silane ($SiH_4$) and oxygen ($O_2$) as reacting precursors. In some other embodiments, the isolation ILD layer 280 may be formed using a sub-atmospheric CVD (SACVD) process or high aspect-ratio process (HARP), in which process gases may include tetraethylorthosilicate (TEOS) and ozone ($O_3$). In yet other embodiments, the ILD layer 280 may be formed using a spin-on-dielectric (SOD) process, such as hydrogen silsesquioxane (HSQ) or methyl silsesquioxane (MSQ). Other processes and materials may be used. In some embodiments, the ILD layer 280 can have a multi-layer structure, by way of example and not limitation, a thermal oxide liner layer with silicon nitride formed over the liner. Thereafter, a thermal annealing may be optionally performed to the ILD layer 280.

In FIG. 30, a contact hole may be formed by any suitable process in the ILD layer 280. Subsequently, a conductive material layer fills in the contact hole. In some embodiments, the conductive material layer includes TiN, TaN, Ta, Ti, Hf, Zr, Ni, W, Co, Cu, Ag, Al, Zn, Ca, Au, Mg, Mo, Cr, or the like. In some embodiments, the conductive material layer may be formed by CVD, PVD, plating, ALD, or other suitable technique. Subsequently, a planarization process such as chemical mechanical polish (CMP) is performed to remove a portion of the conductive material layer above a top surface of the ILD layer 280. After planarization, a gate contact 294 is formed. The gate contact 294 goes through the ILD layer 280 to provide electrical contact to the gate stack.

Figure 31:
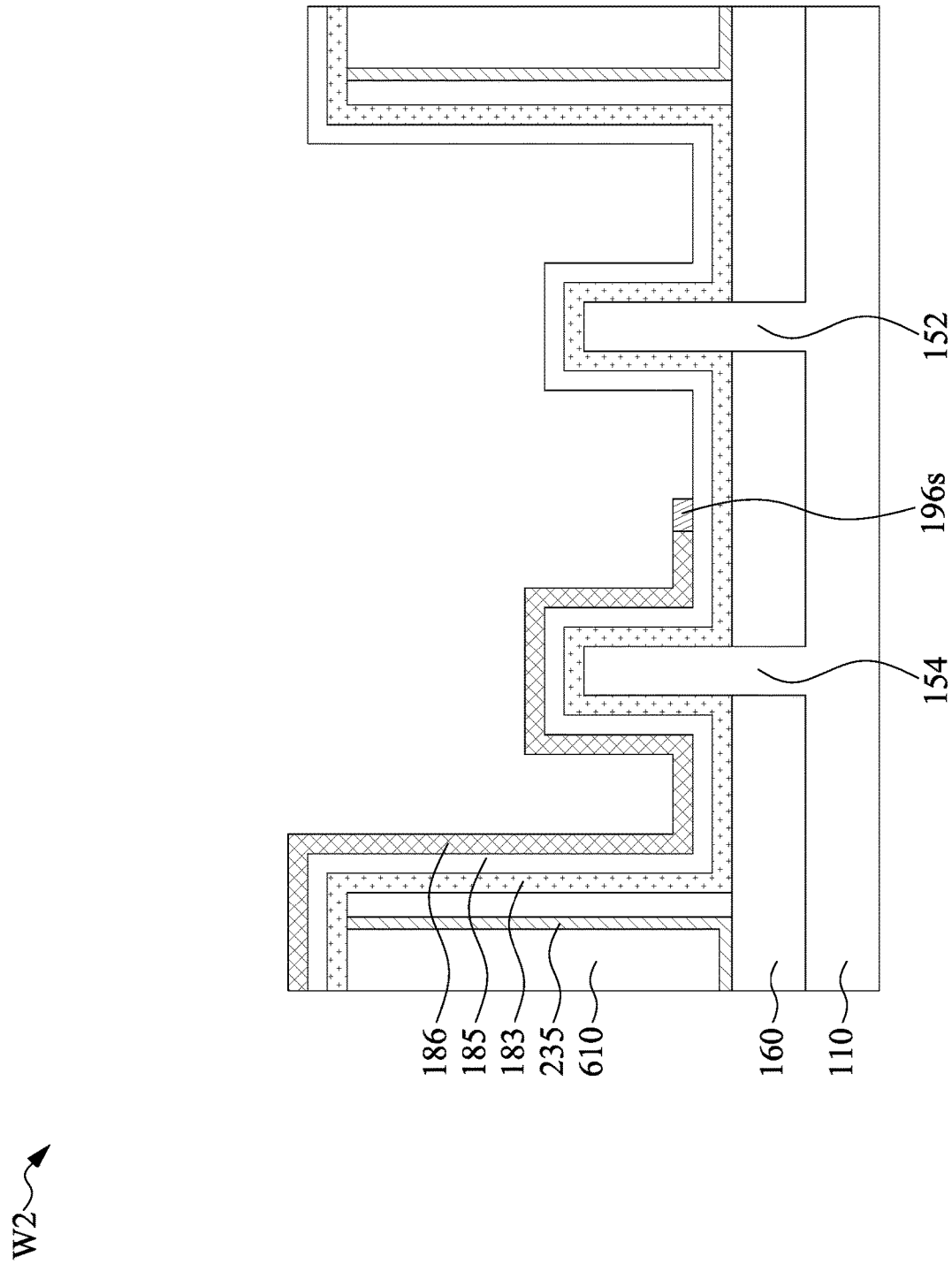
FIGS. 31 and 32 illustrate a semiconductor device at various stages of the method according to some embodiments of the present disclosure.

Reference is made to FIGS. 30 and 31. FIGS. 30 and 31 illustrate a method for manufacturing a semiconductor device in a wafer W2 in different stages in accordance with some embodiments. Operations for forming the wafer W2 are substantially the same as the operations for forming the wafer W1 described in foregoing descriptions and thus are not repeated herein for the sake of clarity. FIGS. 30 and 31 illustrates another practical profile of the semiconductor device manufactured using the method M relative to FIGS. 26 and 30.

FIG. 31 illustrates the wafer W2 at a stage corresponding to FIG. 26 according to some alternative embodiments of the present disclosure. As shown in FIG. 31, the sacrificial layer 192, the patterned mask layer 194, and the selective growth layer 196A may be removed using an ashing process in an ambient of $N_2$, $H_2$, $O_2$ and a temperature of about 150° C. to about 350° C., while a portion of the selective growth layer 196A remains on an end of the work function metal layer 186 as a residue 196s. The residue 196s is similar to the selective growth layer 196A in terms of composition and formation. Hence, a carbon signal or the like can be detected at the end of the work function metal layer 186.

Figure 32:
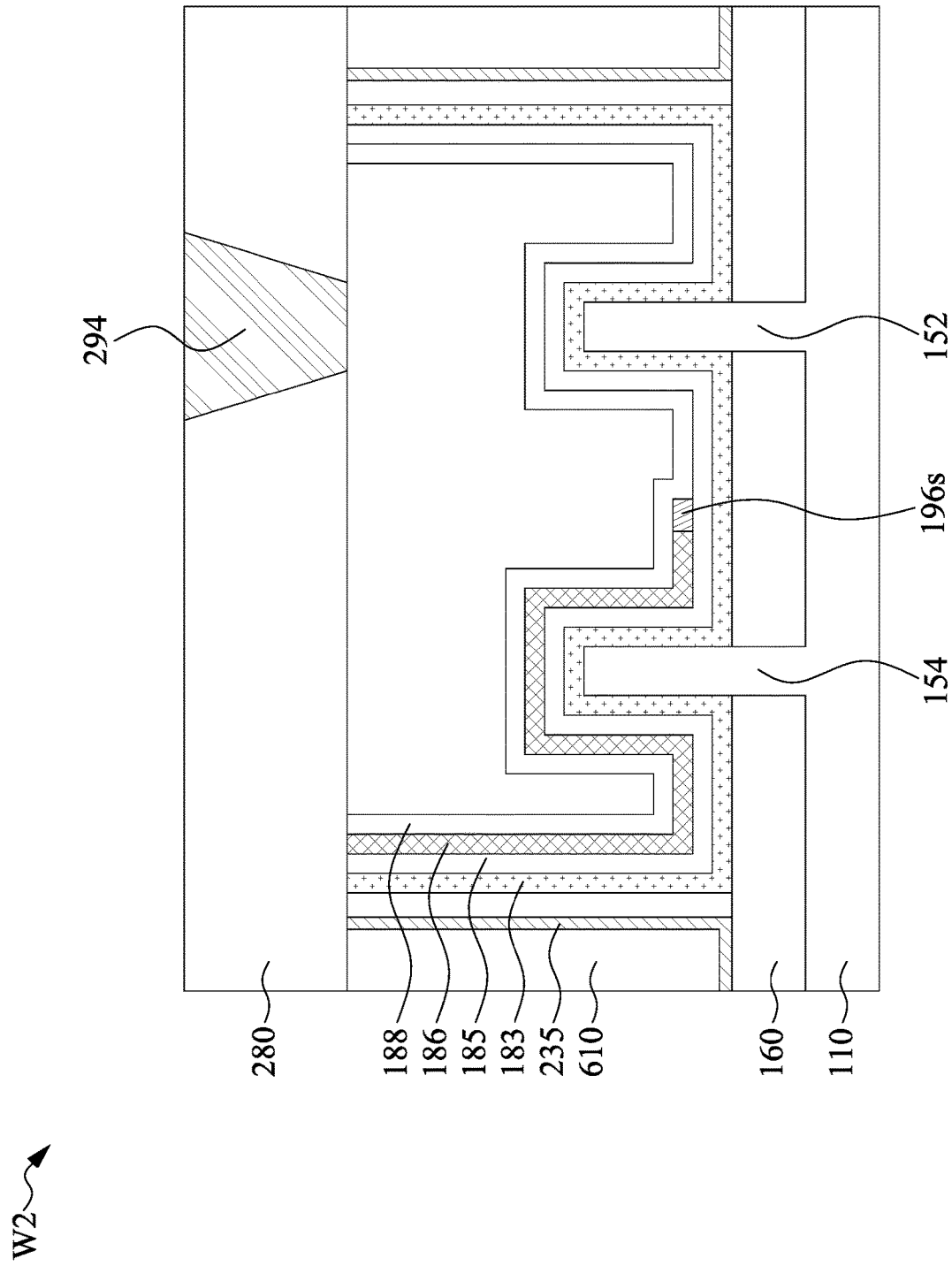

FIG. 32 illustrates the wafer W2 at a stage corresponding to FIG. 30 according to some alternative embodiments of the present disclosure. As shown in FIG. 32, residue 196s of the selective growth layer 196A is laterally between the semiconductor fins 152 and 154, vertically between the work function metal layers 186 and 188, and in contact with the end of the work function metal layer 186.

According to the aforementioned embodiments, it can be seen that the present disclosure offers advantages in fabricating semiconductor devices. It is understood, however, that other embodiments may offer additional advantages, and not all advantages are necessarily disclosed herein. An advantage is that a selective growth layer is interposed between the BARC and the gate dielectric layer which may act as a seal protection to protect the work function metal layer below the BARC during the etching process for the residue of the work function metal layer exposed by the BARC. If there is no selective growth layer formed between the sacrificial layer and the gate dielectric layer, the work function metal layer under the BARC may be etched during the etching process for the work function metal residue and cannot reach a preset amount for the transistor, then in turn adversely affects the performance of the semiconductor device.

In some embodiments, a method for manufacturing a semiconductor device includes forming a work function metal layer over the first and second semiconductor fins extending upward from a substrate; forming a sacrificial layer straddling the first semiconductor fin but not overlapping the second semiconductor fin; patterning the first work function metal layer using the sacrificial layer, resulting in a patterned work function metal layer under the sacrificial layer, and a work function metal residue in the vicinity of the second semiconductor fin; selectively forming a protective layer on a side surface of the sacrificial layer and a side surface of the patterned first work function metal layer; removing the work function metal residue after selectively forming the protective layer; after removing the work function metal residue, removing the sacrificial layer and the protective layer; and forming a second work function metal layer over the first and second semiconductor fins.

In some embodiments, a method for manufacturing a semiconductor device includes forming a work function metal layer over the first and second semiconductor fins extending upward from a substrate; forming a antireflective coating (ARC) over the work function metal layer; forming a photo resist layer over the sacrificial layer; patterning the ARC through the photo resist layer; patterning the work function metal layer through the patterned ARC; after patterning the work function metal layer, conformally forming a bonding layer over the substrate; performing a baking process at a first temperature such that a first portion of the bonding material selectively bonds to the ARC; removing a second portion of the bonding material; etching a work function metal residue exposed by the ARC; removing the first portion of the bonding material, the photo resist layer, and the ARC; and forming a filling metal over the work function metal layer.

In some embodiments, a semiconductor device includes a substrate, first and second semiconductor fins, a first work function metal layer, an organic residue, and a second work function metal layer. The first and second semiconductor fins extends upward from the substrate. The first work function metal layer covers the first semiconductor fin and free from the second semiconductor fin. The organic residue is in contact with an end of the first work function metal layer. The second work function metal layer is over the first and second semiconductor fins and above the first work function metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first work function metal layer over first and second semiconductor fins extending from a substrate;
   forming a sacrificial layer straddling the first semiconductor fin but not overlapping the second semiconductor fin;
   patterning the first work function metal layer using the sacrificial layer as an etching mask, resulting in a patterned first work function metal layer under the sacrificial layer, and a work function metal residue in a vicinity of the second semiconductor fin;
   selectively forming a protective layer on a side surface of the sacrificial layer and a side surface of the patterned first work function metal layer;
   removing the work function metal residue after selectively forming the protective layer;
   after removing the work function metal residue, removing the sacrificial layer and the protective layer; and
   after removing the sacrificial layer and the protective layer, forming a second work function metal layer over the first and second semiconductor fins.

2. The method of claim 1, wherein the sacrificial layer comprises an antireflective material.

3. The method of claim 1, wherein selectively forming the protective layer comprises:
   forming a bonding material at least on the side surface of the sacrificial layer and the side surface of the patterned first work function metal layer; and
   performing a baking process that causes an acid present in the sacrificial layer to react with the bonding material to form the protective layer.

4. The method of claim 3, wherein the baking process is performed at a temperature in a range from about 250 to about 350 degrees Celsius.

5. The method of claim 1, wherein the sacrificial layer comprises a thermal acid generator.

6. The method of claim 1, wherein the protective layer comprises a backbone chemical structure, and a grafting monomer and an acid switchable monomer chemically bonded to the backbone chemical structure.

7. The method of claim 1, wherein forming the sacrificial layer comprises:
   forming a sacrificial material over the first and second semiconductor fins; and
   curing the sacrificial material at a temperature in a range from about 150 to about 200 degrees Celsius.

8. The method of claim 7, furthering comprising:
   patterning the sacrificial material to expose the second semiconductor fin.

9. The method of claim 1, wherein removing the work function metal residue is performed by a wet etching process.

10. The method of claim 1, wherein removing the sacrificial layer and the protective layer is performed by an ashing process.

11. A method for manufacturing a semiconductor device, comprising:
    forming a work function metal layer over first and second semiconductor fins within a substrate;
    forming a antireflective coating (ARC) over the work function metal layer;
    forming a photo resist layer over the ARC;
    patterning the ARC through the photo resist layer;
    patterning the work function metal layer through the patterned ARC;
    after patterning the work function metal layer, conformally forming a bonding material over the substrate;
    performing a baking process at a first temperature such that a first portion of the bonding material selectively bonds to the ARC;
    removing a second portion of the bonding material;
    etching a work function metal residue exposed by the ARC;
    removing the first portion of the bonding material, the photo resist layer, and the ARC; and
    forming a filling metal over the work function metal layer.

12. The method of claim 11, wherein the first temperature is in a range from about 250 to about 350 degrees Celsius.

13. The method of claim 11, wherein after forming the ARC and prior to forming the photo resist, baking the ARC at a second temperature lower than the first temperature to crosslink polymer of the ARC.

14. The method of claim 11, wherein the ARC comprises a first thermal acid generator and a second thermal acid generator different than the first thermal acid generator.

15. The method of claim 11, wherein forming the photo resist layer over the ARC comprises:
    coating a photo resist material over the ARC; and
    pre-exposure baking the photo resist material at a second temperature lower than the first temperature.

16. The method of claim 11, wherein forming the photo resist layer over the ARC comprises:
    coating a photo resist material over the ARC;
    patterning the photo resist material; and
    post-exposure baking the patterned photo resist material at a second temperature lower than the first temperature.

17. The method of claim 11, wherein the ARC comprises a crosslinker.

18. A method for manufacturing a semiconductor device, comprising:
    forming a gate dielectric strip over first and second fins extending upwardly from a semiconductor substrate;
    forming a metal strip over the gate dielectric strip;
    forming an antireflective coating (ARC) structure over the metal strip, the ARC structure overlapping with the first fin and non-overlapping the second fin;
    performing a first etching process on the metal strip resulting in a metal layer under the ARC structure and a metal residue in a vicinity of the second fin, the metal layer having an end surface set back from a sidewall of the ARC structure;
    selectively growing a polymer material as an etching mask on the end surface of the metal layer and the sidewall of the ARC structure;
    after selectively growing the polymer material, performing a second etching process on the metal residue;
    after performing the second etching process, removing the ARC structure and the polymer material; and
    depositing a filling material over the first and second fins.

19. The method of claim 18, wherein the ARC structure comprises a first thermal acid generator and a second thermal acid generator having a higher temperature to generate acid than the first thermal acid generator.

20. The method of claim 18, wherein the second etching process is a wet etching process.

* * * * *